US012813186B2

(12) United States Patent
Lai et al.

(10) Patent No.: US 12,813,186 B2
(45) Date of Patent: Nov. 24, 2026

(54) MULTIPLE DIE STRUCTURE AND METHOD OF FABRICATING THEREOF

(71) Applicant: Taiwan Semiconductor Manufacturing Company, Ltd., Hsinchu (TW)

(72) Inventors: Chieh-Lung Lai, Taichung City (TW); Meng-Liang Lin, Hsinchu (TW); Chun-Yueh Yang, Taipei City (TW); Hsien-Wei Chen, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 771 days.

(21) Appl. No.: 18/156,960

(22) Filed: Jan. 19, 2023

(65) Prior Publication Data

US 2024/0087902 A1 Mar. 14, 2024

Related U.S. Application Data

(60) Provisional application No. 63/375,401, filed on Sep. 13, 2022.

(51) Int. Cl.
*H10P 52/00* (2026.01)
*H10P 54/00* (2026.01)
(Continued)

(52) U.S. Cl.
CPC .............. *H10P 52/00* (2026.01); *H10P 54/00* (2026.01); *H10W 74/141* (2026.01);
(Continued)

(58) Field of Classification Search
CPC ................. H01L 21/3043; H01L 21/78; H01L 2221/68345; H01L 2221/68368;
(Continued)

(56) References Cited

U.S. PATENT DOCUMENTS 6,107,164 A * 8/2000 Ohuchi .................. H01L 24/11 438/114
8,288,842 B2 10/2012 Lee
(Continued)

FOREIGN PATENT DOCUMENTS

TW I697056 B 6/2020
TW 202113997 A 4/2021

OTHER PUBLICATIONS

H. Zheng, Y. Wang, X. Luo, L. Xu and S. Liu, "Effect of die shape on die tilt in die attach process," 2013 14th International Conference on Electronic Packaging Technology, Dalian, China, 2013, pp. 651-655 (Year: 2013).*

*Primary Examiner* — Julio J Maldonado
*Assistant Examiner* — Paul A Berry
(74) *Attorney, Agent, or Firm* — HAYNES AND BOONE, LLP

(57) ABSTRACT

The present disclosure is directed to methods and devices for devices including multiple die. A wafer is received having a plurality of die and a plurality of scribe lines. A dicing process is performed on the wafer. The dicing process includes identifying a first scribe line of the plurality of scribe lines, the first scribe line interposing a first die and a second die of the plurality of die; and performing a partial cut on the first scribe line. In embodiments, other scribe lines of the wafer are, during the dicing process, fully cut. After the dicing, the first die and the second die are mounted on a substrate such as an interposer. The first die and the second die are connected by a portion of the first scribe line, e.g., remaining from the partial cut, during the mounting.

20 Claims, 25 Drawing Sheets

(51) Int. Cl.

| | |
|---|---|
| ***H10W 70/685*** | (2026.01) |
| ***H10W 72/00*** | (2026.01) |
| ***H10W 72/20*** | (2026.01) |
| ***H10W 74/10*** | (2026.01) |
| ***H10W 74/15*** | (2026.01) |
| ***H10W 90/00*** | (2026.01) |

(52) U.S. Cl.
CPC .......... *H10W 90/00* (2026.01); *H10W 70/685* (2026.01); *H10W 72/0198* (2026.01); *H10W 72/072* (2026.01); *H10W 72/073* (2026.01); *H10W 72/222* (2026.01); *H10W 72/252* (2026.01); *H10W 74/15* (2026.01); *H10W 90/724* (2026.01); *H10W 90/734* (2026.01)

(58) Field of Classification Search
CPC ....... H01L 21/6835; H01L 2221/68322; H01L 21/6836; H01L 2221/68327; H01L 2221/68354; H01L 24/92; H01L 24/95; H01L 2224/95; H01L 21/02013; H01L 21/02016; H01L 21/02021; H01L 24/94; H01L 24/96; H01L 24/97; H01L 2223/54453; H01L 2224/94; H01L 23/49816; H01L 21/77; H01L 24/20; H01L 24/82; H01L 23/5226; H01L 24/19; H01L 23/3107; H01L 21/56; H01L 25/5283; H01L 23/481; H01L 21/304; H01L 21/7806; H01L 25/072; H01L 25/0655; H01L 2221/10; H01L 2224/95136; H01L 2224/98; H01L 23/5383; H10D 89/011–015; H10P 58/20; H10P 58/22; H10P 54/40; H10P 54/92; H10P 54/90; H10P 58/00; H10P 56/00; H10P 72/74; H10P 72/7414; H10P 72/7416; H10P 72/7424; H10P 72/7428; H10P 72/7434; H10P 72/7402; H10P 52/00; H10P 54/00; H10W 72/0198; H10W 72/072; H10W 72/073; H10W 72/222; H10W 72/252; H10W 90/00; H10W 90/724; H10W 90/734; H10W 70/685; H10W 70/611; H10W 70/686; H10W 70/687; H10W 70/09; H10W 74/111; H10W 20/20; H10W 90/701; H10W 46/501; H10B 80/00
See application file for complete search history.

(56) References Cited

U.S. PATENT DOCUMENTS

| | | | | |
|---|---|---|---|---|
| 9,748,187 | B2 | 8/2017 | Lee | |
| 10,535,572 | B2 | 1/2020 | Liao | |
| 2006/0003552 | A1* | 1/2006 | Okada | H01L 21/78 438/692 |
| 2013/0049195 | A1* | 2/2013 | Wu | H10P 54/00 257/738 |
| 2017/0032981 | A1* | 2/2017 | Chinnusamy | H10P 50/642 |
| 2018/0005916 | A1* | 1/2018 | Chen | H01L 23/3675 |

* cited by examiner

MULTIPLE DIE STRUCTURE AND METHOD OF FABRICATING THEREOF

PRIORITY

This application claims benefit of U.S. Provisional Application Ser. No. 63/375,401, filed Sep. 13, 2022, the entire disclosure of which is incorporated herein by reference.

BACKGROUND

The semiconductor integrated circuit (IC) industry has experienced rapid growth. Continuing advances in semiconductor manufacturing processes have resulted in integrated circuits ("ICs") having semiconductor devices with finer features and/or higher degrees of integration. Functional density (i.e., the number of interconnected devices per IC chip area) has generally increased while feature size (i.e., the smallest component that can be created using a fabrication process) has decreased. This scaling-down process generally has generally provided benefits by increasing production efficiency and lowering associated costs.

Advanced IC packaging technologies have been developed to further reduce density and/or improve performance of ICs, which are incorporated into many electronic devices. For example, IC packaging has evolved such that multiple ICs may be included in a packaged device. Structures and methods which improve the configuration of these devices is desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
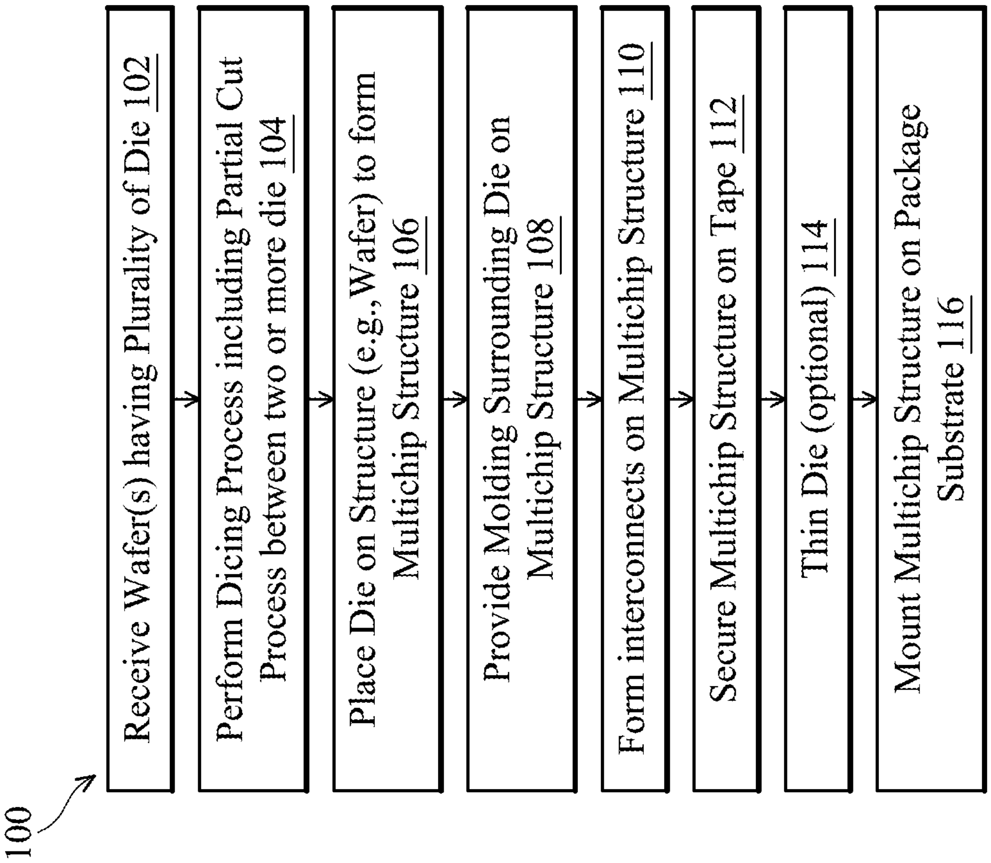
FIG. 1 is a flow chart of an embodiment of method for fabricating a multichip structure, according to various aspects of the present disclosure.

The present disclosure is generally directed to devices and methods of fabricating thereof including multiple die in a single packaged device such that the disclosure is directed to devices and methods of fabricating devices having multiple chips mounted on a single substrate. The present disclosure is illustrated in some implementations with respect to chip-on-wafer on substrate, or CoWoS devices. However, other implementations of packages are possible including, but not limited to integrated-fan-out (InFo) and other type of fan out or fan in systems, other three-dimensional (3D) packaging technologies, 2.5D package technologies, SoIC including direct die-to-die attachment, chip-on-wafer devices, package-on-package devices, and/or other advanced package technologies.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a flow chart of a method 100 for fabricating a multi-die or multichip device. As discussed above, the multichip device can include any packaging type that includes multiple die or chips in a single final packaged component. Here, exemplary embodiments include a multichip device, in particular, a chip-on-wafer (e.g., an interposer) structure that is mounted to a package substrate, referred to as chip-on-wafer-on-substrate (CoWoS) technology. However, other implementations and other packaging structures are possible. Different embodiments may have different advantages, and no particular advantage is required of any embodiment. The figures of the present disclosure, including FIG. 1 have been simplified for the sake of clarity to better understand the inventive concepts of the present disclosure. Additional features can be added in the figures, and some of the features described below can be replaced, modified, or eliminated in other embodiments.

The method 100 can facilitate a reduction in processing steps, cost, and/or time, for example as discussed below in a reduction of the pick-and-place operation mounting die on an interposer. The method 100 can also facilitate a control of the placement of die in the structure, e.g., on the interposer, such that spacing and dimensional offsets are controlled and understood. No embodiment demands each advantage, and other advantages may also be appreciated.

The method 100 begins at block 102 where a substrate is received having a plurality of die. The substrate may be a semiconductor wafer such as a silicon wafer. Referring to the example of FIGS. 2A, 2B, a wafer 200 (also referred to as a wafer substrate) is received. In some embodiments, the wafer 200 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In an embodiment, the wafer 200 is a silicon wafer including a bulk silicon having a plurality of devices formed thereon.

A plurality of semiconductor devices of a plurality of die 202 are provided on the semiconductor wafer. The semiconductor die 202 are separated by scribe lines or saw lines 204. The die 202 are disposed in an array form on the wafer 200, the saw streets or scribe lines create a lattice like structure between the die 202. In some implementations, the scribe lines 204 may include test structures, but do not include functional end-product devices. The semiconductor die 202 may comprise a memory device or component, a processor, other chip logic, or a combination thereof. In an embodiment, the die 202 provide memory devices such as static random access memory (SRAM).

Circuitry of a die 202 can include various passive microelectronic devices and active microelectronic devices, such as resistors, capacitors, inductors, diodes, p-type field effect transistors (PFETs), n-type FETs (NFETs), metal-oxide semiconductor (MOS) FETs (MOSFETs), complementary MOS (CMOS) transistors, bipolar junction transistors (BJTs), laterally diffused MOS (LDMOS) transistors, high voltage transistors, high frequency transistors, other suitable devices, or combinations thereof. In some embodiments, one or more of the transistors are configured as planar transistors, where a channel of a planar transistor is formed in a semiconductor substrate between respective source/drains and a respective gate is disposed on the channel (e.g., on a portion of the semiconductor substrate in which the channel is formed). In some embodiments, one or more of the transistors are configured as non-planar transistors, where a channel of a non-planar transistor is formed in a semiconductor fin that extends from a semiconductor substrate and between respective source/drains on/in the semiconductor fin, where a respective metal gate is disposed on and wraps the channel of the semiconductor fin (i.e., the non-planar transistor is a fin-like FET (FinFET)). In some embodiments, one or more of the transistors are configured as non-planar transistors having channels formed in semiconductor layers suspended over a semiconductor substrate and extending between respective source/drains, where a respective metal gate is disposed on and surrounds the channels (i.e., the non-planar transistors are gate-all-around (GAA) transistors). In some embodiments, various device components and/or device features can include a semiconductor substrate, doped wells (e.g., n-wells and/or p-wells), isolation features (e.g., shallow trench isolation (STI) structures and/or other suitable isolation structures), metal gates (for example, a metal gate having a gate electrode over a gate dielectric), gate spacers along sidewalls of the metal gates, source/drain features (e.g., epitaxial source/drain features, lightly doped source/drain regions, heavily doped source/drain regions, etc.), and/or a multilayer interconnect (MLI) feature.

Figure 2A:
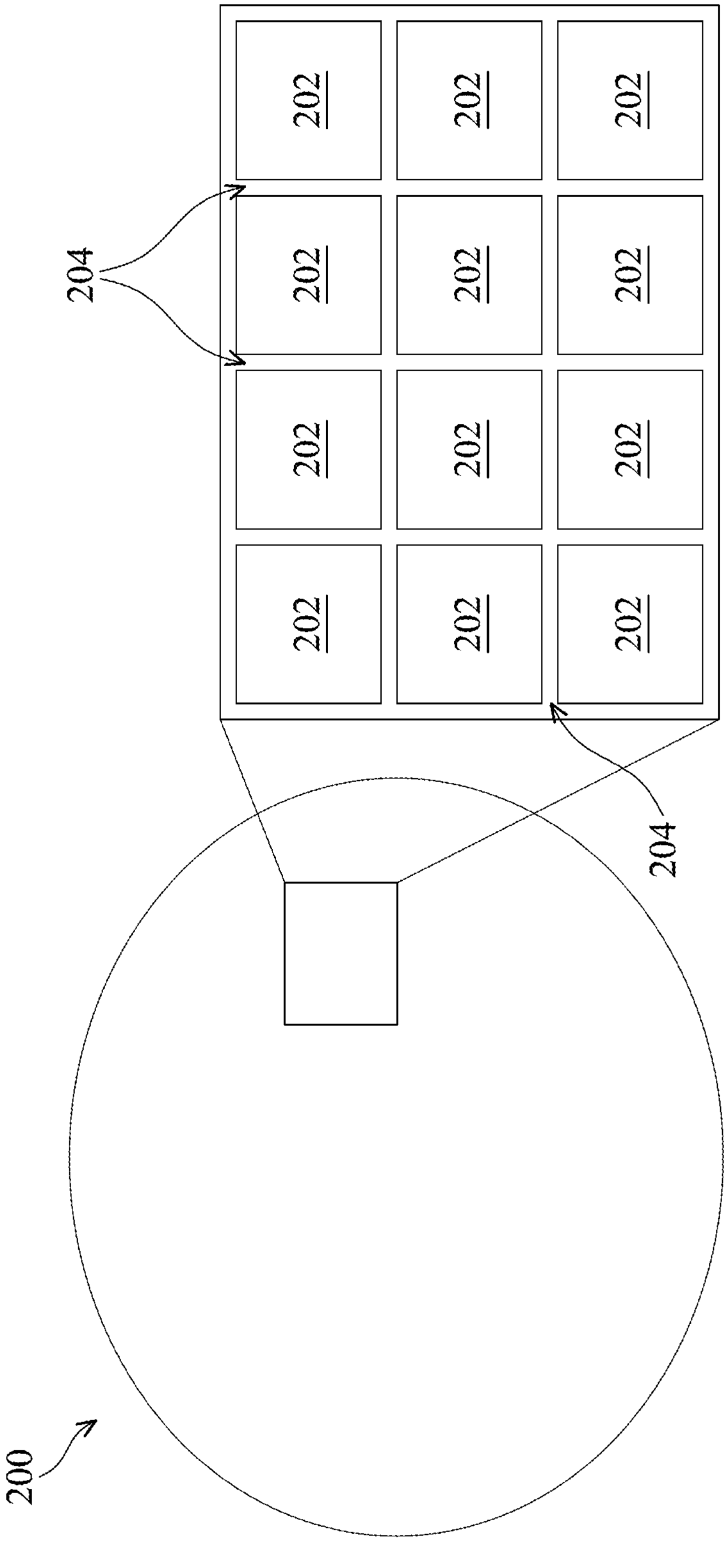
FIGS. 2A, 2B, 3A, 3B, 3C, 3D, 3E, 4, 5, 6, 7, 8, 9, 10, 11, 12, 13 and 14 illustrate process steps corresponding to the embodiment of FIG. 1, according to various aspects of the present disclosure.
Figure 2B:
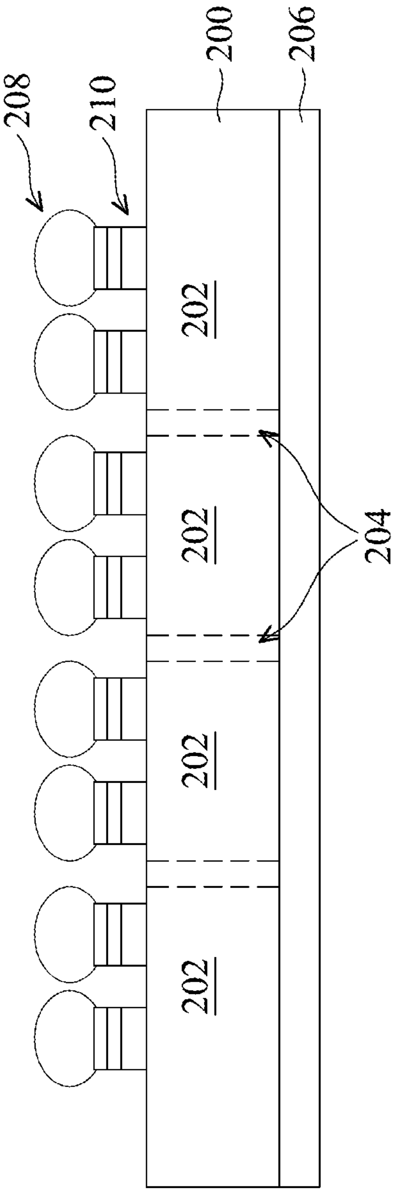

FIG. 2B illustrates a cross-sectional view of an embodiment of a portion of the wafer 200 of FIG. 2A illustrating four die 202. In the embodiment, the die 202 include conductive pillars (or posts) 210 and a microbump 208 disposed on the conductive pillar. The microbumps 208 (e.g., μbump) and conductive pillars 210 carry signals to/from the die 202. The microbumps 208 may comprise a conductive material such as copper or solder. The conductive pillars 210 may include under bump metallization (UBM), post-passivation interconnect (PPI), pads, barrier layers, and other conductive features. The conductive pillars 210 may include aluminum, copper, silver, gold, nickel, tungsten, alloys thereof, and/or multi-layers thereof. A passivation layer (not shown) may be formed on the surface of the die 202 adjacent the conductive pillars 210.

In some implementations, the opposite side of the die 202 (opposing the conductive interconnect structures 208/210) is silicon of the base wafer. In some implementations, one or more layers are formed on the opposite side of the device such as a metallization layer and/or an insulating layer such as silicon dioxide, silicon nitride, silicon oxynitride, silicon carbide, polyimide, and/or other suitable dielectric materials. This surface of the wafer 200 and die 202 can be attached to a supporting material 206, also referred to as a dicing tape, which is adhered to the wafer 200 and dies 202.

The method 100 includes block 104 where a dicing process is performed on the wafer. The dicing process may be performed by sawing or scribing operations such as mechanical sawing, laser sawing, patterned etching, scribing followed by mechanical breaking, and/or other dicing methods. As the semiconductor wafer 200 is cut through, the dies 202 remain in position as they are physically supported by the supporting material 206, and do not fall away from the supporting material 206.

Figure 3A:
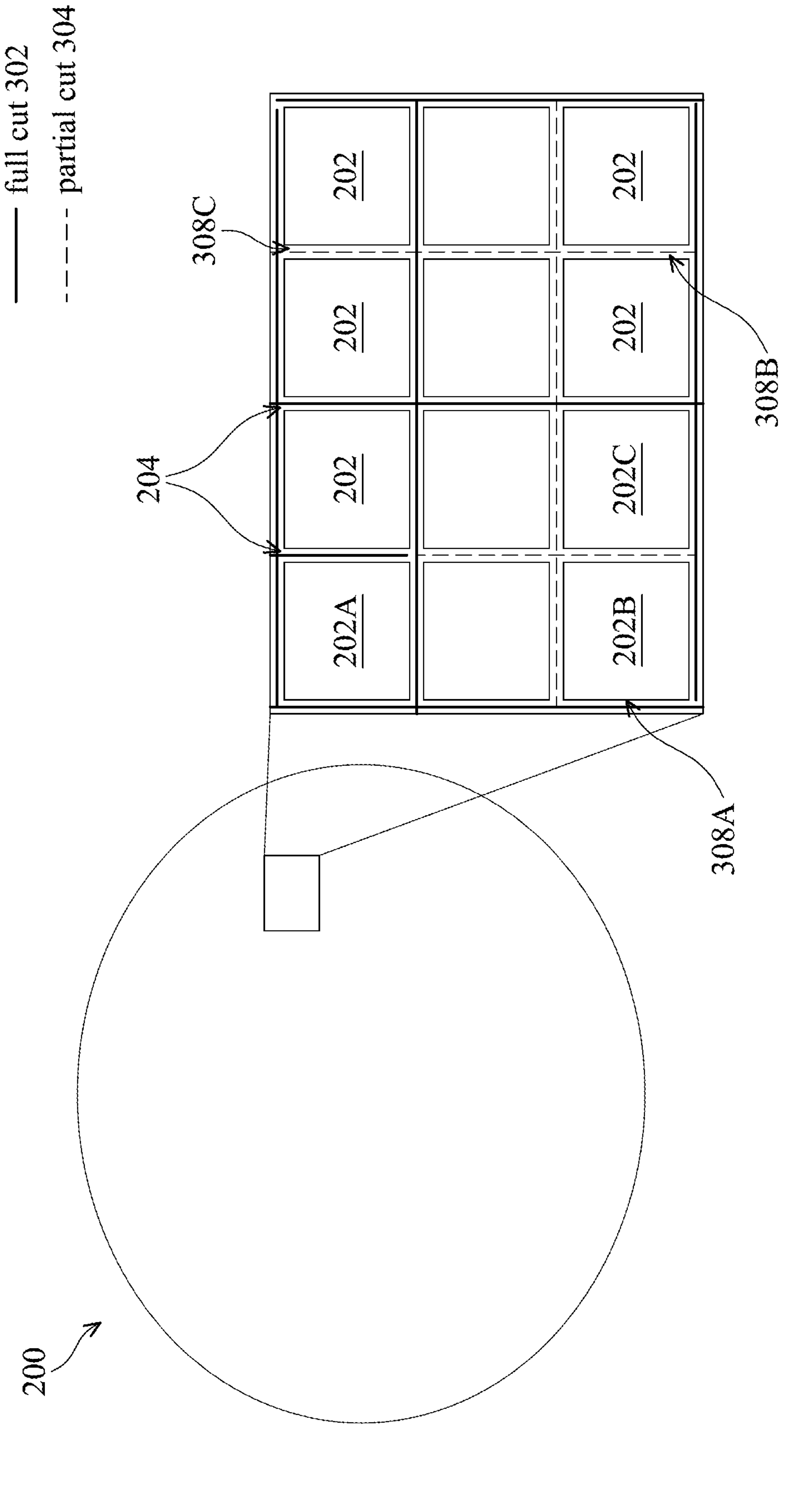

The dicing process may also be referred to as singulation as it typically includes separating the die from one another by cutting at each scribe line to form individual, separated die 202. In the singulation, the resulting separated die can be separately sold, shipped, packaged, or integrated individually into other packages. Referring to the example of FIGS. 3A, 3B, a full cut 302 extends through the scribe line 204 of the wafer 200 separating the adjacent die 202 into individual components. The full cut 302 exposes the supporting material 206. For example, die 202A of FIG. 3A is singulated into an individual die, physically separated from neighboring die 202.

In implementations of block 104, is it determined which die 202 are to be singulated into individual die as discussed above, and which die 202 will remain physically attached to one or more adjacent die 202 to form a die grouping 308. A die grouping is two or more die 202 that remain physically connected after the singulation process is complete. In other words, at the pick-and-place operation moving the die 202 from the dicing tape to another substrate, a plurality of die is connected to one another. In some implementations, the physical connection is provided by a bridge, or a portion of the substrate 200, which is discussed in further detail below. The die groupings 308 may include die of the same technology node. The die groupings 308 may include die of the same functionality (e.g., memory). In some implementations, the die groupings 308 may include different functionality, for example, where die of different types are fabricated on a same wafer 200.

Figure 3B:
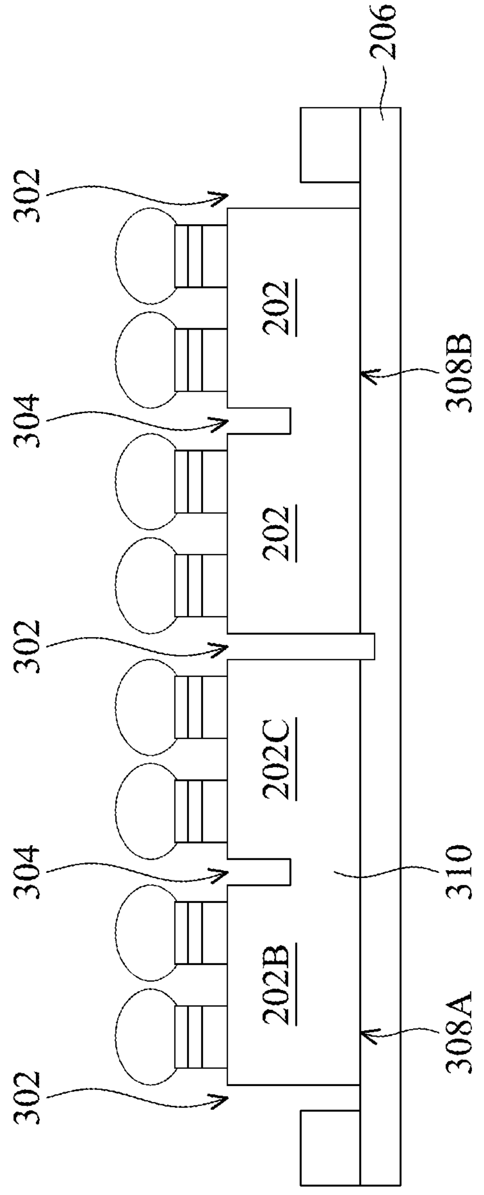

In some implementations, to form the die groupings 308, the scribe line 204 between adjacent die 202 is only partially removed maintaining a thickness of the substrate 200 (and, in particular, a thickness of the scribe line 204 of the substrate 200) between adjacent die 202. In other words, a partial cut 304 is performed in the scribe line 204 between adjacent die 202. The partial cut 304 stops within the wafer 200 and does not expose the supporting material (e.g., dicing tape) 206. The partial cut 304 is illustrated between die 202B and die 202C of FIGS. 3A, 3B. Thus, after the partial cut 304, the die 202B and 202C remain physically connected by a portion of the scribe line 204, which is referred to herein as a bridge, after the dicing process. This is because the partial cut 304 does not break through the substrate 200. FIG. 3B is illustrative of the die 202B and die 202C remaining connected by a bridge 310. The bridge 310 may be portion of the scribe line 204 that extends between adjacent die 202 and remains after singulation is complete. In some implementations, no functional devices or interconnects are disposed in the bridge 310. In a further embodiment, the bridge 310 is silicon (e.g., bulk silicon of the wafer 200). In an embodiment, the bridge 310 has a length approximately equal to the scribe line 204

In the illustrative embodiment, the die 202B and die 202C are included in a die grouping 308A. FIG. 3A illustrates four die 202 forming a die grouping 308A, however any number of die are possible. Similarly, four die 202 remain physically connected due to partial cut 304 to form die grouping 308B. Two die 202 remain physically connected due to partial cut 304 to form die grouping 308C. These groupings are illustrative only and not intended to be limiting.

As discussed above, a partial cut 304 removes some, but not all, of the scribe line 204 of the wafer 200 between die 202. In an embodiment, the partial cut removes about 50% of the thickness of wafer 200 between die. In an embodiment, the partial cut removes between 1% and 99% of the thickness of the wafer 200 between die. In a further embodiment, the partial cut removes between 10% and 90% of the thickness of the wafer 200 between die. In a further embodiment, the partial cut removes between approximately 20% and 80% of the thickness of the wafer 200.

Figure 3D:
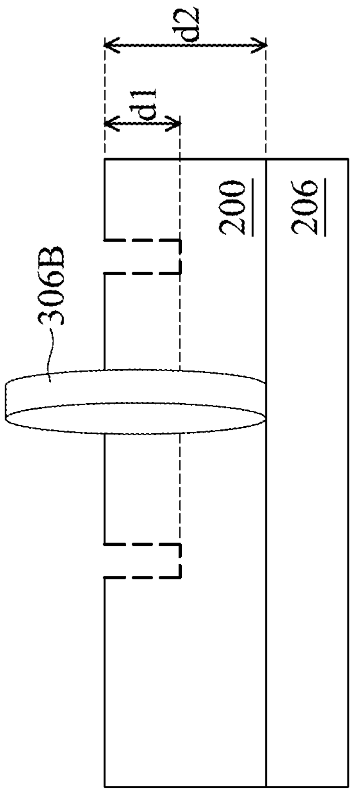
Figure 3C:
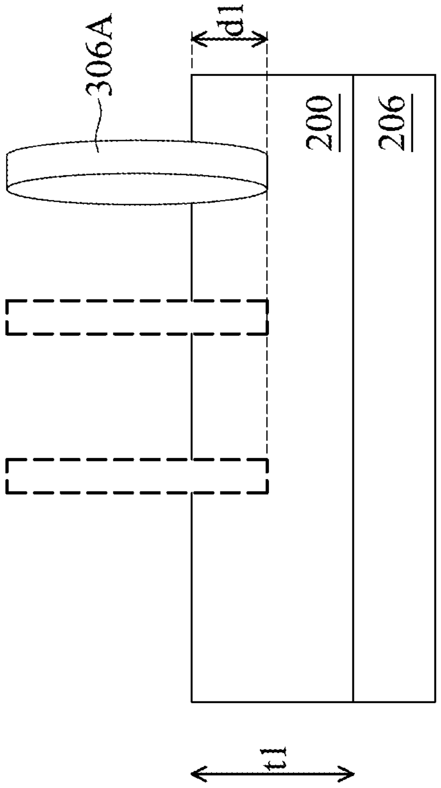
Figure 3E:
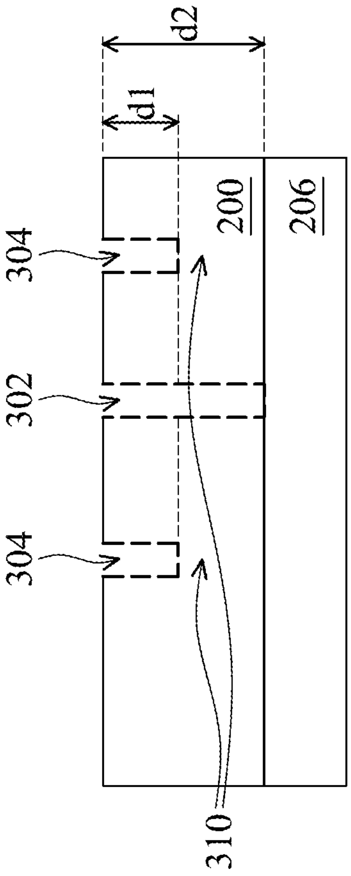

FIGS. 3C, 3D, and 3E are illustrative of an embodiment of a method of performing full cut 302 and partial cut 304 on the wafer 200. A saw blade 306 is illustrative, but as discussed above, other cutting instruments (e.g., laser) are also possible. The wafer 200 has a thickness t1. FIG. 3C illustrates a first step where a partial cut 304 is performed in the substrate 200 using a first pass of the saw 306A. The partial cut 304 extends a distance d1 from a top surface of the wafer 200. The distance d1 is less than the thickness t1. In some implementations, the distance d1 is between approximately 1% and 99% of thickness t1. In some further implementations, the distance d1 is between approximately 10% and 90% of thickness t1. In yet additional embodiments, the distance d1 is between approximately 20% and 80% of thickness t1. In some implementations, the distance d1 is approximately 50% of thickness t1. FIG. 3D illustrates a second step where a second cut by a second pass of the saw 306B is performed. In some implementations, the saw 306B is the same blade as saw 306A. In other implementations, the saw 306B includes different dimensions. The second pass by the saw 306B provides a full cut 302 on the substrate 200. The full cut 302 extends a distance d2 from a top surface of the wafer 200. The distance d2 may be approximately equal to the thickness t1. The distance d2 may be approximately equal or greater than the thickness t1. In some implementations, the distance d2 is approximately equal to distance d1. Note that the regions for partial cut 304 are not processed by the second pass by the saw 306B. Other methods of forming partial cut and full cuts are possible and within the scope of the present disclosure.

The method 100 then proceeds to block 106 where the die, after dicing operation, are placed on a structure to form a multichip structure. In some implementations, the die are placed on a structure including an interposer substrate. The die may be placed in an operation referred to as a pick-and-place operation, which may be performed by placement systems commonly referred to as pick-and-place machines. The pick-and-place operation may be performed by robotic machines capable of high precision placement of components such as die. The operation includes attaching a component (e.g., suction on an arm of the pick-and-place machine) to the die, moving the die to a second location, and placing the die on a structure (e.g., interposer) at that location.

Figure 4:
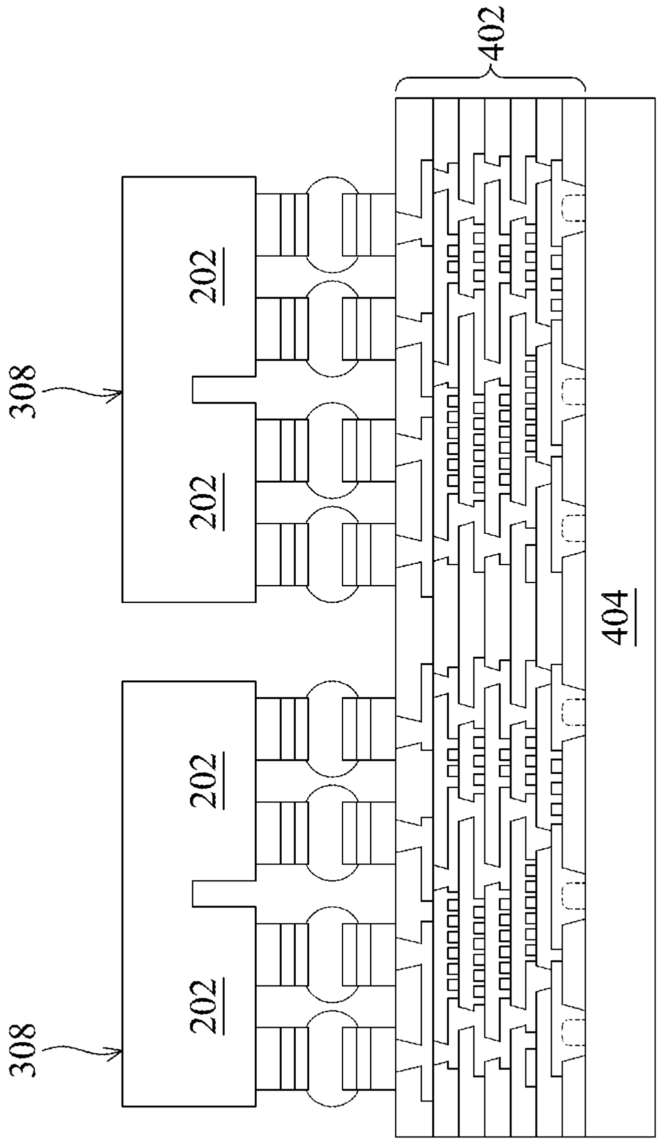

Referring to the example of FIG. 4, the die groupings 308 and any other die, including singulated die 202 from the wafer 200 or die from other wafers have been placed on an interposer 402. A carrier substrate 404 may be disposed on an opposite face of the interposer 402. In some implementations, the carrier substrate 404 is glass. The present method allows for a single pick-and-placement movement to locate a plurality of die onto the interposer 402. This is because the pick-and-place operation can, in one operation, attach to and move the die grouping 308, which moves the number of die included in the die grouping 308 rather than each single die 202 being moved and placed separately. As such, for a die grouping 308 including four die, three pick-and-place movements are eliminated; for a die grouping 308 including two die, a pick-and-place movement is eliminated. Thus, implementations of the method 100 can save operational costs and time in the placement of die on a structure such as an interposer.

In an embodiment, the die and die groupings are placed the interposer 402, which is a silicon interposer. The interposer 402 acts as a structural packaging component and also can serve as an electrical connection among devices 202, among the die 202 and/or other die or components disposed on the interposer, and/or among the die 202 and the input/output terminals of the packaged device. In some implementations, the interposer 402 uses through silicon via (TSV) technology. In some implementations, redistribution layers in the interposer 402 are used to optimize interconnections. The interposer 402 may be an active (e.g., including functional chips, active or passive devices, such as transistors, capacitors, resistors, or diodes) or passive interposer (e.g., providing interconnection). Each of die 202 are bonded, attached, and/or interconnected to interposer 402 by respective interconnect structures, such as bumps (e.g., microbumps) 208.

In some implementations, each of the die 202 and, in particular the die groupings 308, are attached to the interposer 402 by flip-chip bonding by the microbumps 208. The microbumps 208 are physically and electrically connected between the dies 202 of the die groupings 308 and the interposer 402. The microbumps 208 may be connected by solder bonding and reflow, metal-to-metal bonding such as copper-to-copper bonding, and/or other suitable interconnection structures.

As discussed above, the die groups 308 allow for improvements in the pick-and-place process of providing the die on the interposer 402. This is because the die groups 308 allow multiple die to be placed in one step, rather than place singulated die individually. For example, if the die grouping 308A includes four die, there is an improvement of a reducing in 3 times the die placement in terms of cost and time of the process. Further, because the die groups 308 are attached by bridges 310, the placement of the die 202 of the die group 308 with respect to one another is improved. In other words, the gap between adjacent die 202 within a group 308 is held constant to the length of the bridge 310. Further description of the configuration of the die groupings on the interface are described below including with respect to FIGS. 17A, 17B, 18A, 18B, 19A, 19B.

Figure 5:
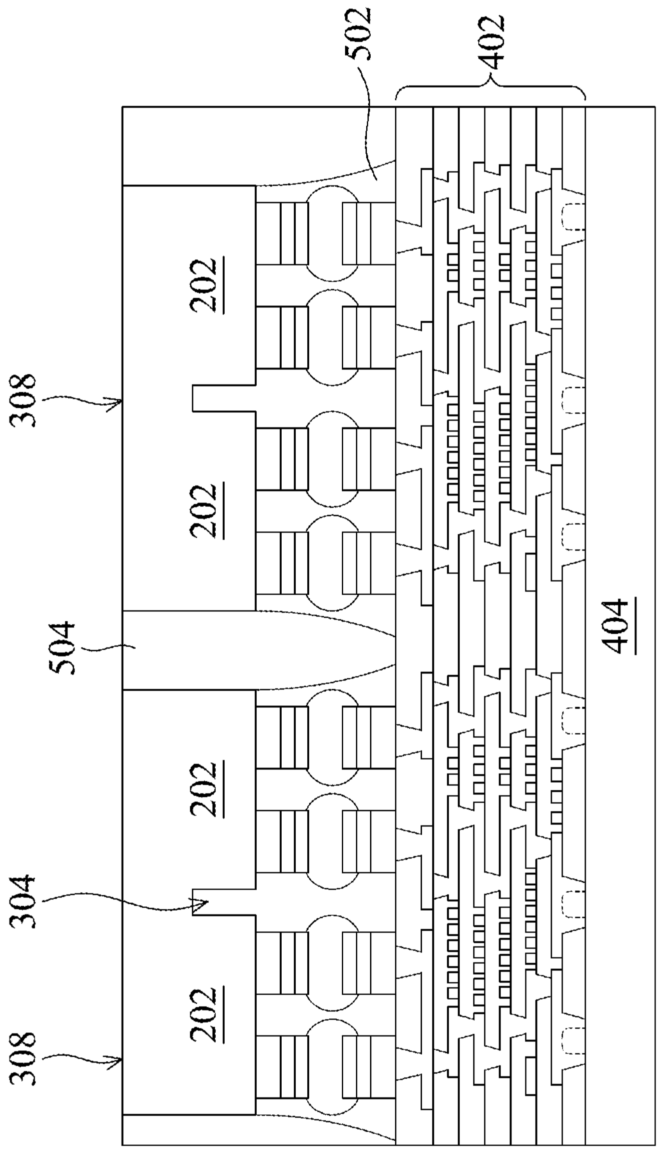

The method 100 then proceeds to block 108 where an underfill and/or molding surrounds the die on the multichip structure. Referring to FIG. 5, in a next step, an underfill structure 502 may be formed to cover the plurality of conductive bumps 208 and fill the space between the die 202 and the interposer 402. In some implementations, the underfill structure 502 may fill the opening between die 202 of a die grouping 308. In an embodiment, the underfill structure 502 enters the region of partial cut 304.

Encapsulant 504 may fill the spaces in between adjacent dies 202 including between adjacent die groups 308, between die groupings 308 and adjacent singulated die, and/or between singulated die on the interposer 402. The encapsulant 504 may extend to a surface of the interposer 402. In some embodiments, the encapsulant 504 further cover outer side walls of the die 202 of the die groupings 308. In some implementations, the underfill structure 502 covers the inner sidewalls of the die groupings 308.

In an embodiment, the encapsulant 504 may include polymers (such as epoxy resins, phenolic resins, silicon-containing resins, or other suitable resins), dielectric materials having low permittivity (Dk) and low loss tangent (Df) properties, or other suitable materials. In an embodiment, the underfill structure 502 may include an epoxy material. In some embodiments, the underfill is a no-flow underfill. The underfill structure 502 may be comprised of a different material than the encapsulant 504.

Figure 15:
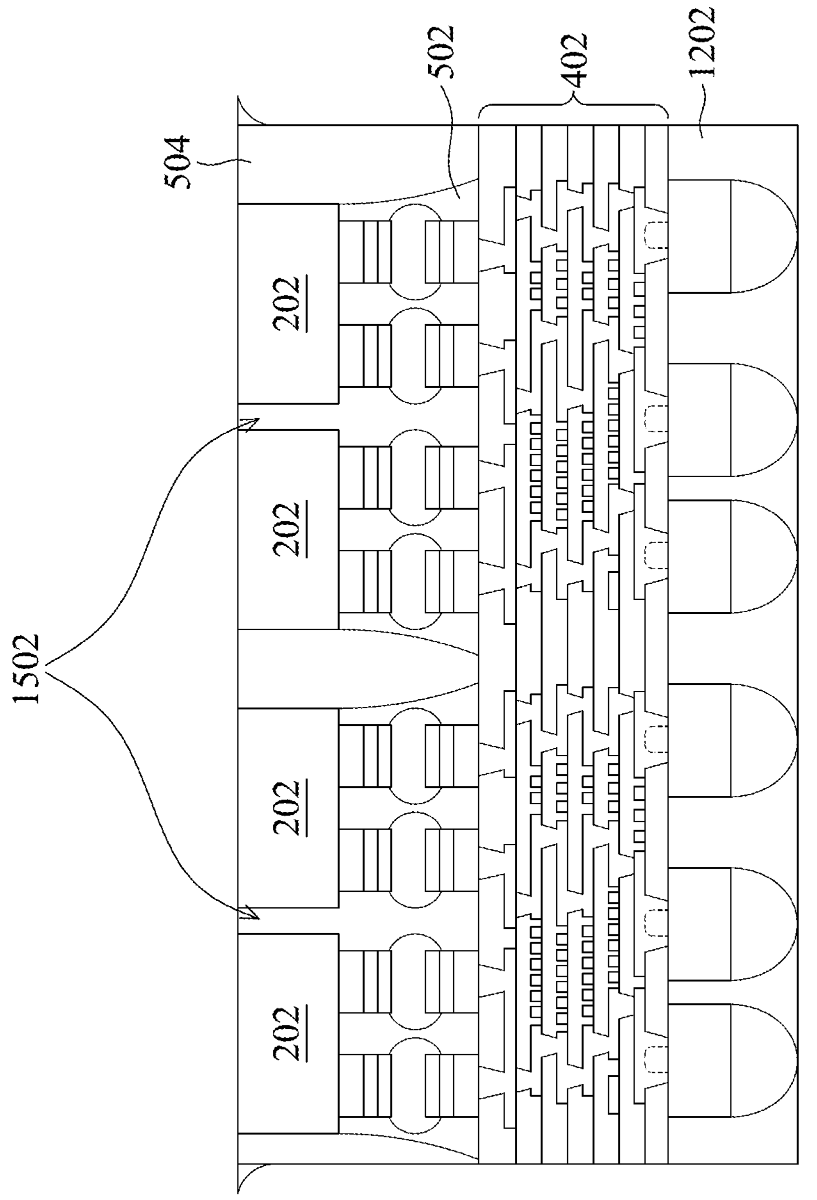
FIGS. 15 and 16 illustrate process steps corresponding to another embodiment of FIG. 1, according to various aspects of the present disclosure.

In some embodiments, a planarization process, including grinding or polishing, may be performed to partially remove the encapsulant, exposing surfaces of the semiconductor dies 202. Accordingly, the surfaces of the semiconductor die 202 are levelled with a surface of the encapsulant. As illustrated by the example of FIG. 5, in some implementations, the grinding stops at a top surface of the die 202. In an embodiment, the grinding may thin a portion of the die 202. In some implementations, after grinding at least a portion of the bridge 310 remains on the device connecting the die 202 of the die groupings 308. In other embodiments, the grinding process may thin the die 202 to the extent that the bridge 310 is removed. FIG. 15 is illustrative of a device where the die 202 are thinned such that the die 202 are separated into individual components with a gap 1502 extending between the die 202 of the former die grouping. It is noted that whether the bridge 310 is maintained or removed in whole or in part, the spacing between the die 202 of the die groupings 308 remains substantially as dictated by the configuration of the die groupings 308 (i.e., the bridge 310 dimensions). In other words, in an embodiment, a distance between die 202A and die 202B of FIG. 15 remains a length of the bridge 310, which in an embodiment is defined by the scribe line 204 width.

Figure 6:
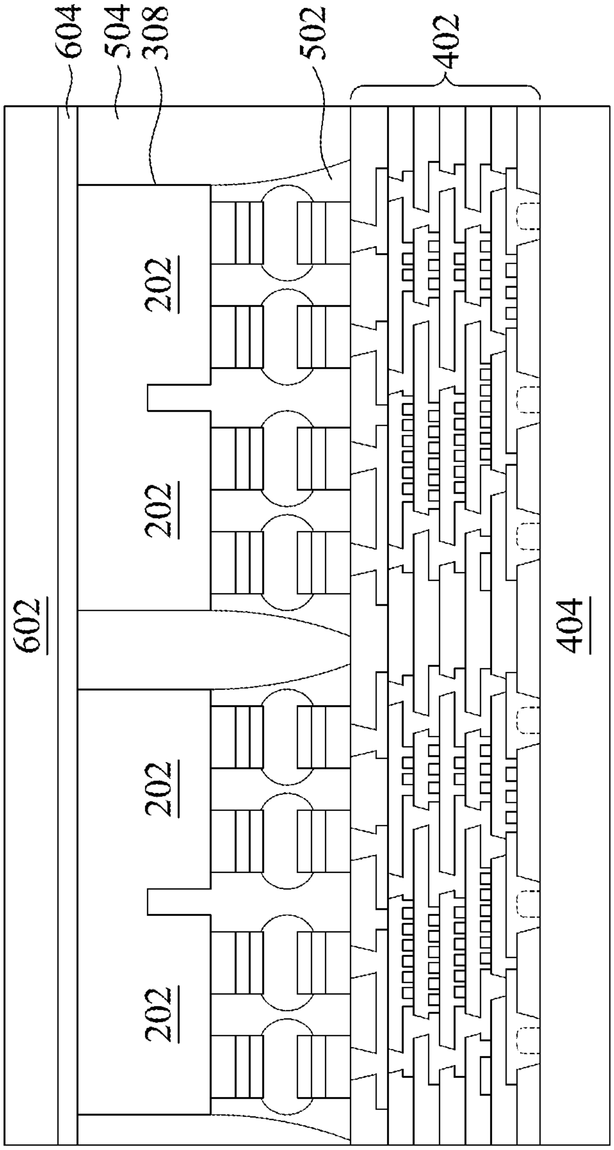
Figure 7:
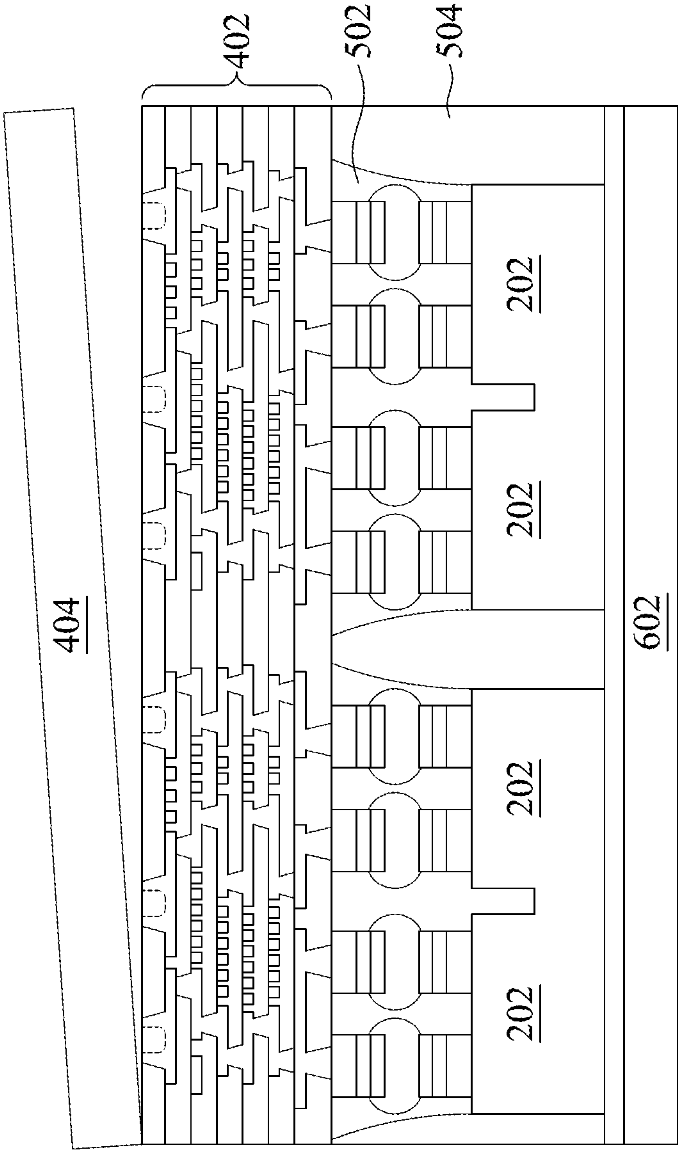

A second carrier substrate 602, illustrated in FIG. 6, may be placed on the surface of the die 202 and encapsulant 504. In an embodiment, the second carrier substrate 602 is a glass substrate. An adhesive 604 may be used to attach the carrier substrate 602.

Figure 8:
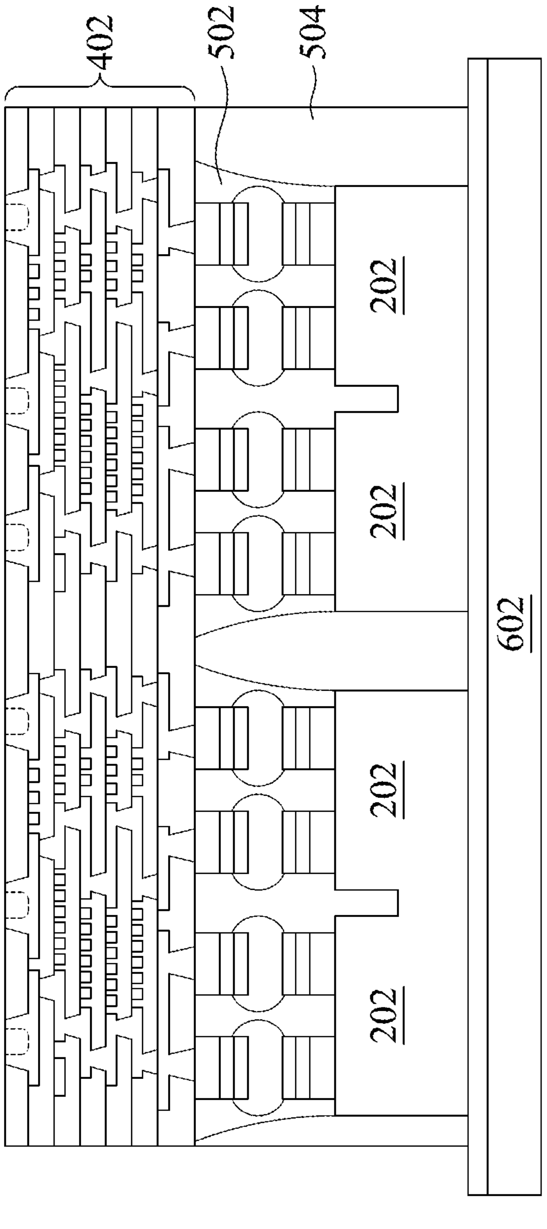
Figure 9:
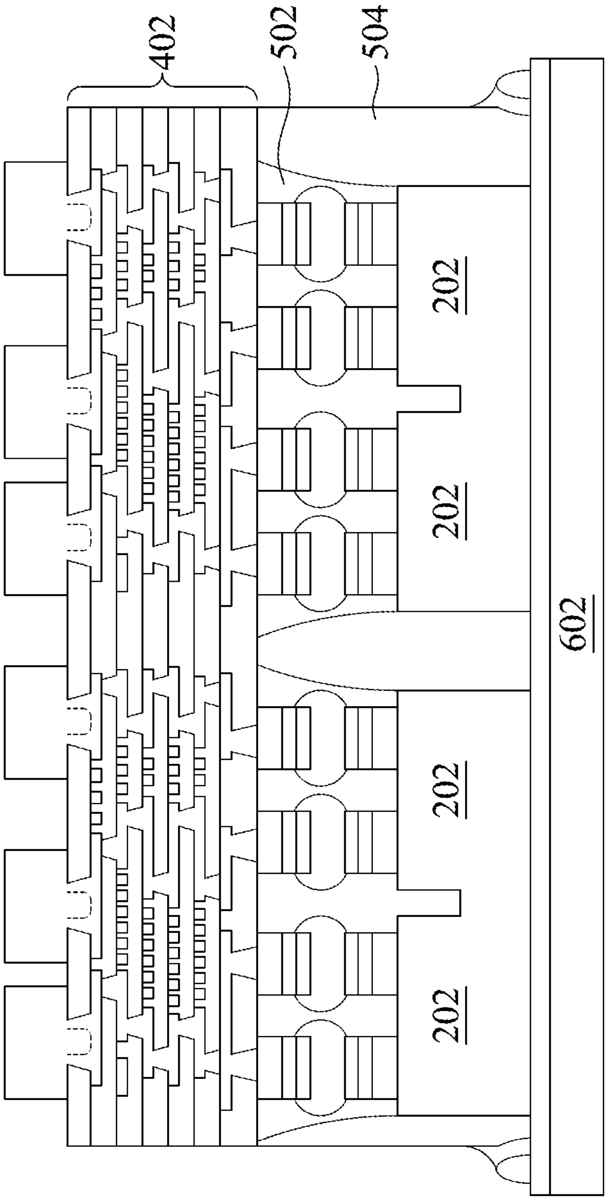

After the second carrier substrate 602 is provided on the structure, the first carrier substrate 404 is de-bonded. In some implementations, the interposer structure 402 and/or surrounding encapsulants 504 may be thinned and/or trimmed. In some embodiments, the devices are fabricated in an array that are subsequently separated into individual devices. Thus, processing may include wafer trimming (FIG. 8), formation of dams (FIG. 9) on the carrier edge of the device, sealing of the gap between dam and interposer edge (FIG. 9), and/or the etchback of a top layer of the interposer 402 to expose an interconnect region (FIG. 9) of the interposer 402 such as a conductive pad.

Figure 10:
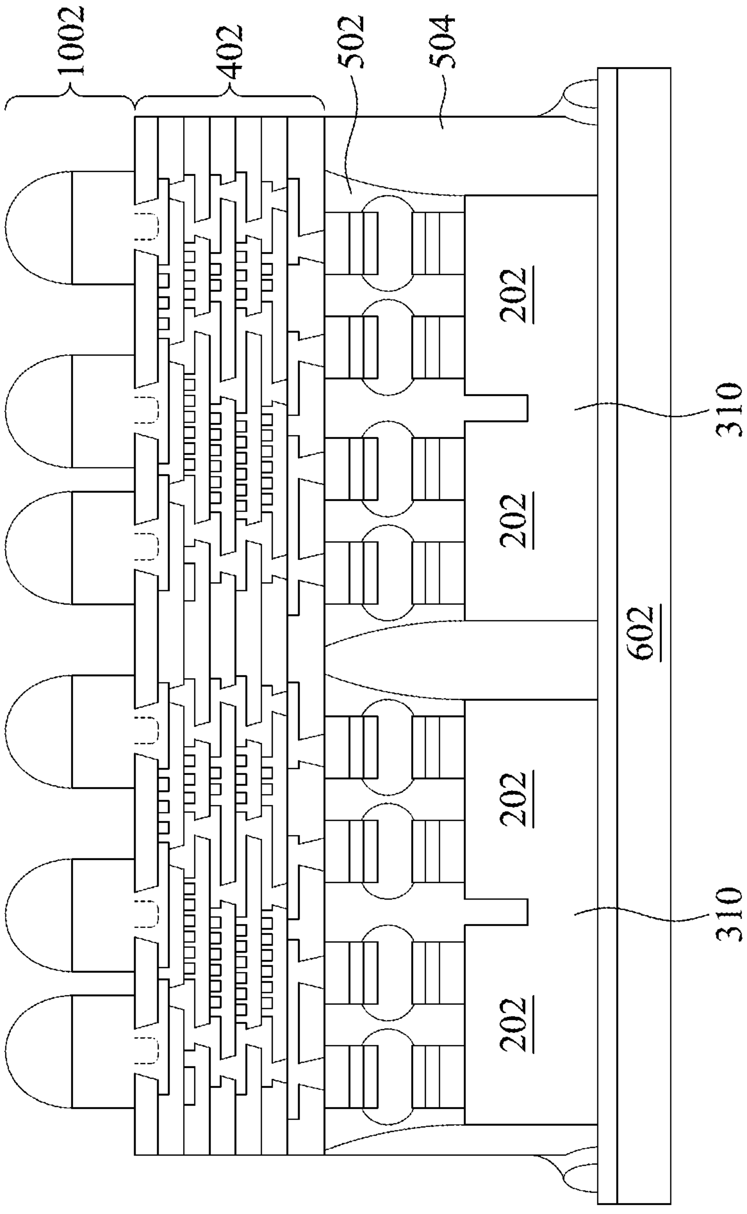

The method 100 includes block 110 where interconnects are formed on the multichip structure. In some implementations, block 110 may be performed prior to block 108. FIG. 10 is illustrative of electrical connectors or interconnects 1002 being formed on the interposer 402. In an embodiment, the electrical connectors 1002 are bumps or balls formed on conductive regions (pads) of the interposer 402. The electrical connectors 1002 are electrically connected (e.g., through traces and/or TSV of the interposer 402) to the devices 202. In an embodiment, the electrical connectors 1002 are formed by a C4 technique (controlled collapse chip connection). The electrical connectors 1002 may include a copper post and a solder cap. For example, the electrical connectors are formed by forming solder-free metal pillars (such as a copper pillar) by sputtering, printing, electroless or electro plating or CVD, and then forming a lead-free cap layer by plating on the metal pillars. A passivation layer may be formed on the interposer 402 surface in regions outside of the conductive pads. Other implementations are possible including that the electrical connectors 1002 are electrical connectors including lead-free solder balls, solder balls, ball grid array (BGA) balls, bumps, other C4 bumps or micro bumps. In some embodiments, the electrical connectors may include a conductive material such as solder, copper, aluminum, gold, nickel, silver, palladium, tin, or a combination thereof. The electrical connectors 1002 are used to bond to a substrate such as circuit substrate, another semiconductor substrate or a packaging substrate.

Figure 11:
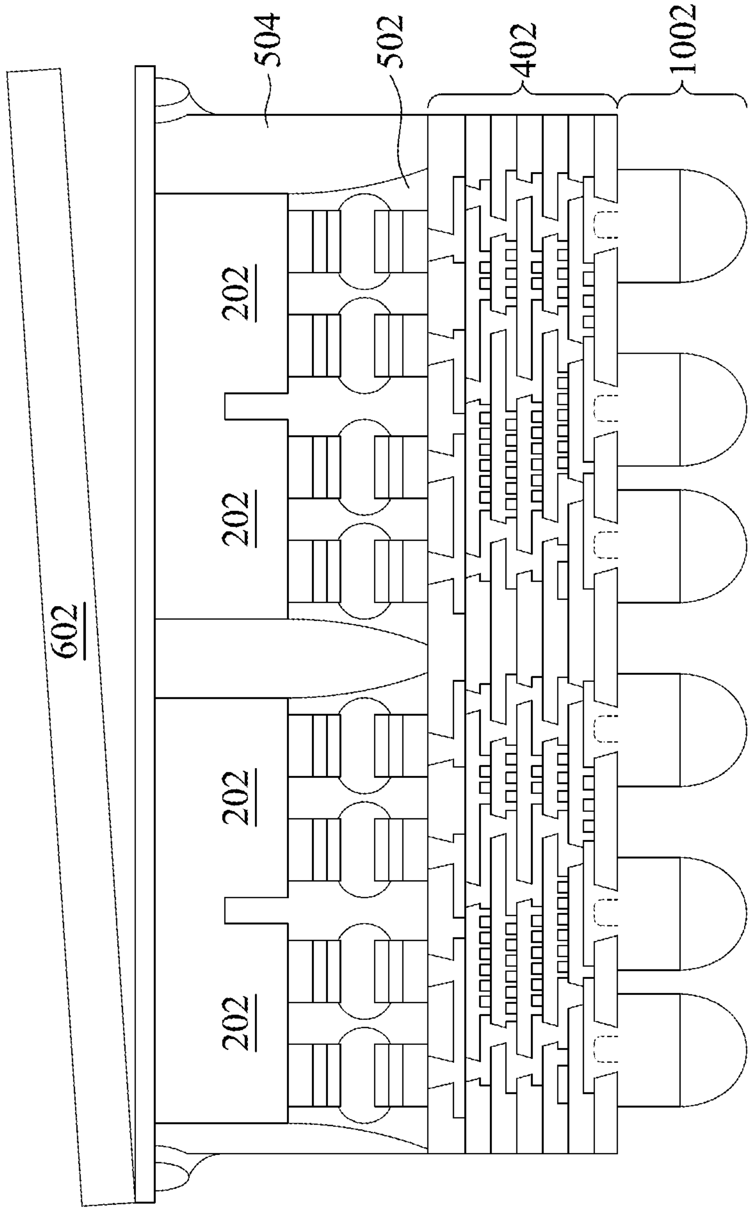
Figure 12:
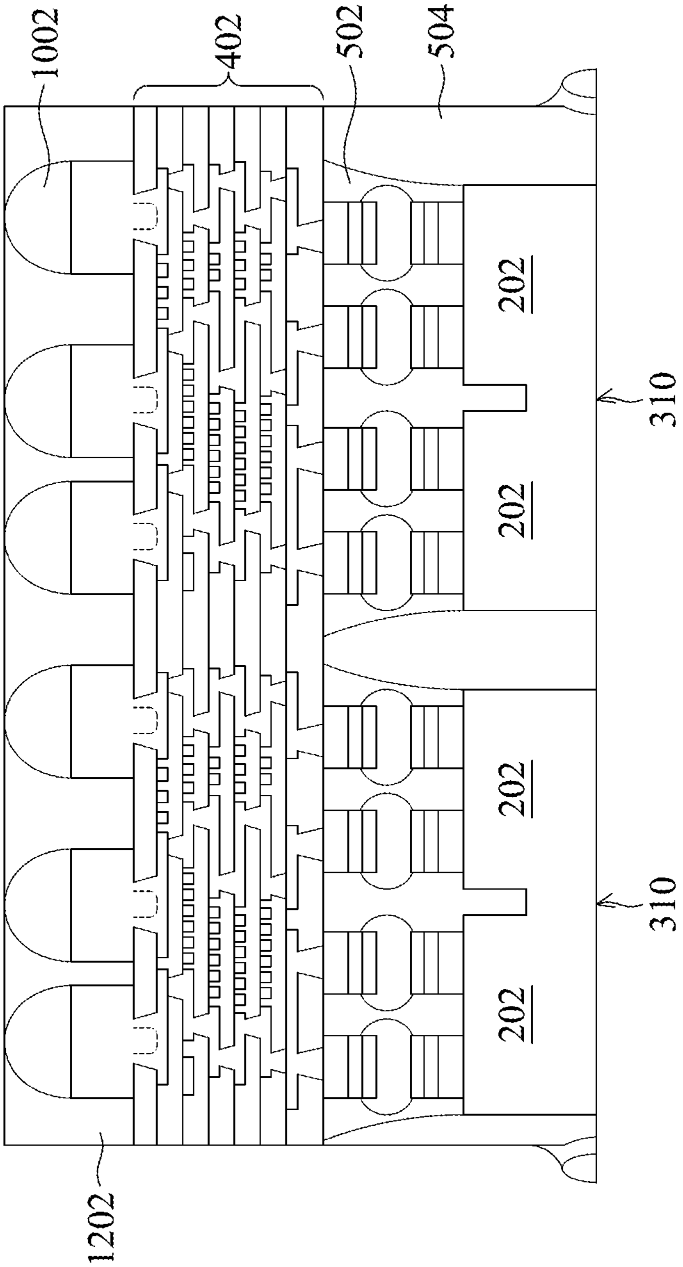

The method 100 includes block 112 where the multichip structure is secured onto a tape for handling for subsequent processing such as singulation. As illustrated in FIG. 11, in a subsequent step, the second carrier substrate 602 is de-bonded. The adhesive 604 is also removed. Like the previous processes, in some implementations the de-bonding process includes projecting a light such as a laser light or an UV light on a de-bond layer (e.g., light-to-heat-conversion release layer) that is attached to the carrier substrate 602, so that the carrier substrate 602 can be easily removed along with the adhesive layer. As illustrated in FIG. 12, after de-bonding the carrier substrate 602, the structure is attached to a tape 1202 (e.g., a backside grinding tape).

Figure 13:
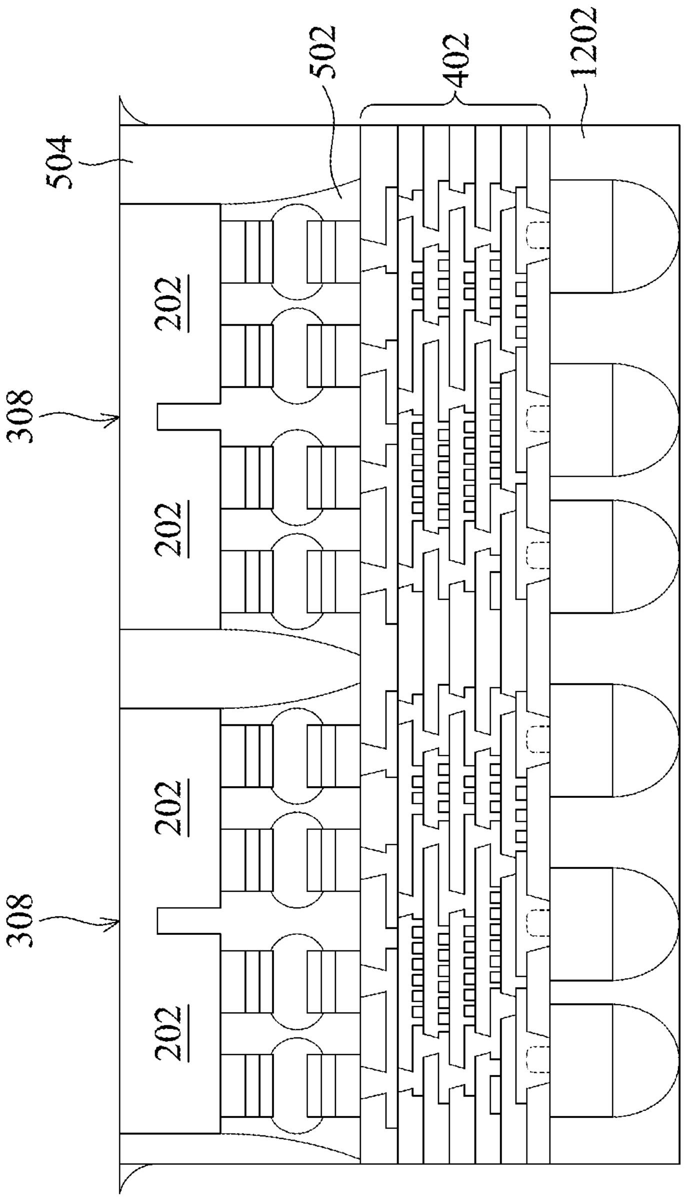

The method 100 includes block 114 where the die are thinned through a grinding or polishing process. In some implementations, block 114 is omitted. The grinding process may thin the die 202 and/or the bridge 310. In some embodiments, the bridge 310 is removed in this step. In other embodiments, the bridge 310 is maintained. As illustrated in FIG. 13, the bridge 310 is maintained on the die grouping 308. FIG. 15 is illustrative of a device where the die 202 are thinned such that the die 202 are separated into individual components with a gap 1502 extending between the die 202 of the former die grouping. Thus, the bridge 310 is removed. It is noted that whether the bridge 310 is maintained or removed in whole or in part, the spacing between the die 202 of the die groupings 308 remains substantially as dictated by the configuration of the die groupings 308 (i.e., the bridge 310 dimensions). In other words, in an embodiment, a distance between die 202A and die 202B of FIG. 15 remains a length of the bridge 310, which in an embodiment is defined by the scribe line 204 width.

Figure 14:
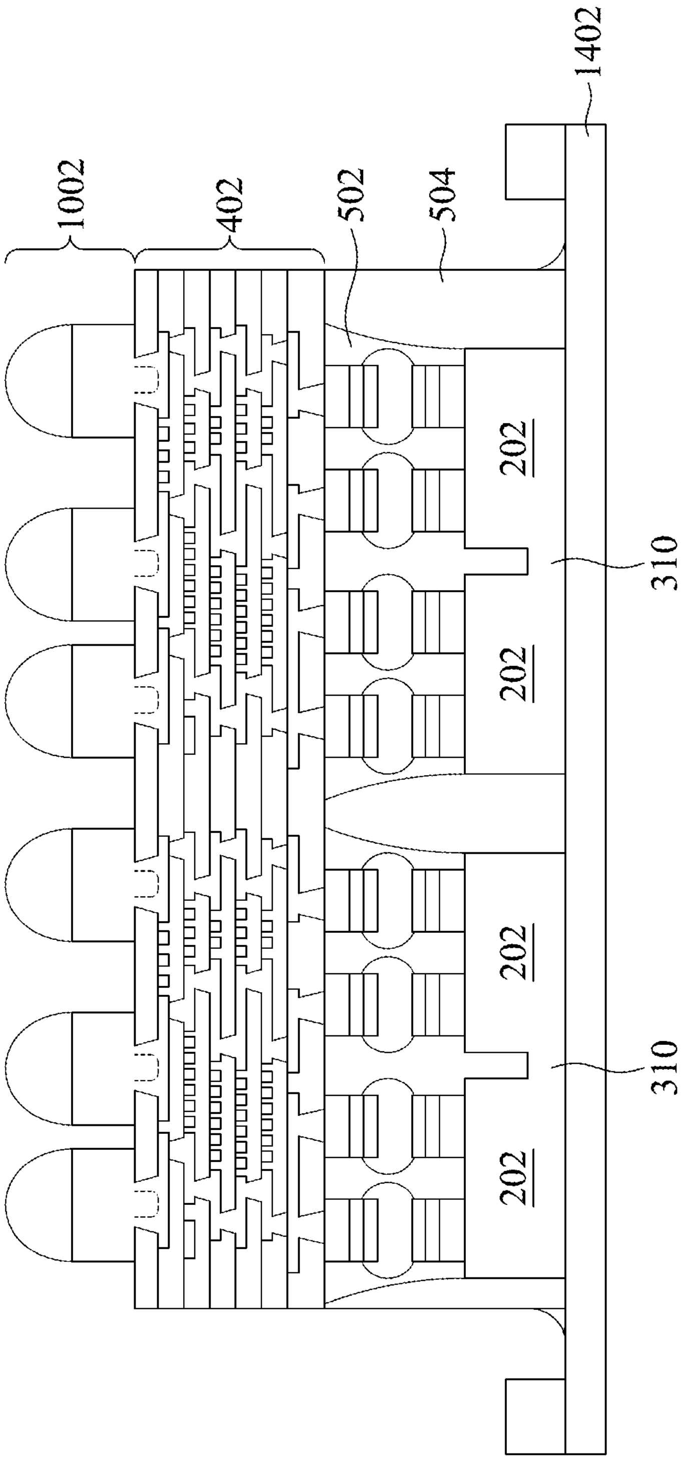

The method 100 includes block 116 where the multichip structures (e.g., die and interposer) are attached to a structure. In some implementations, the multichip structure is first singulated into separate devices. In some embodiments, the dicing process or the singulation process typically involves dicing with a rotating blade or a laser beam. In other words, the dicing or singulation process is, for example, a laser cutting process, a mechanical sawing process, or other suitable processes. After the second dicing process, the singulated multichip structure illustrated in FIG. 14 can be obtained.

The multichip structure is mounted on a structure to perform the singulation. Referring to the example of FIG. 14, the multichip structure is mounted on a dicing tape 1402. The tape 1202 may be removed in a de-taping process after mounting on the dicing tape 1402. The structures may then be singulated. In some embodiments, the dicing process or the singulation process typically involves dicing with a rotating blade or a laser beam. In other words, the dicing or singulation process is, for example, a laser cutting process, a mechanical sawing process, or other suitable processes. After the second dicing process, the singulated, packaged multi-die structure illustrated in FIG. 14 can be obtained. Block 116 may include one or more UV processes. Subsequent processes may include mounting the multichip structure on a package structure and removing the dicing tape 1402. In some implementations, the package structure is a material such as an organic laminate.

Figure 16:
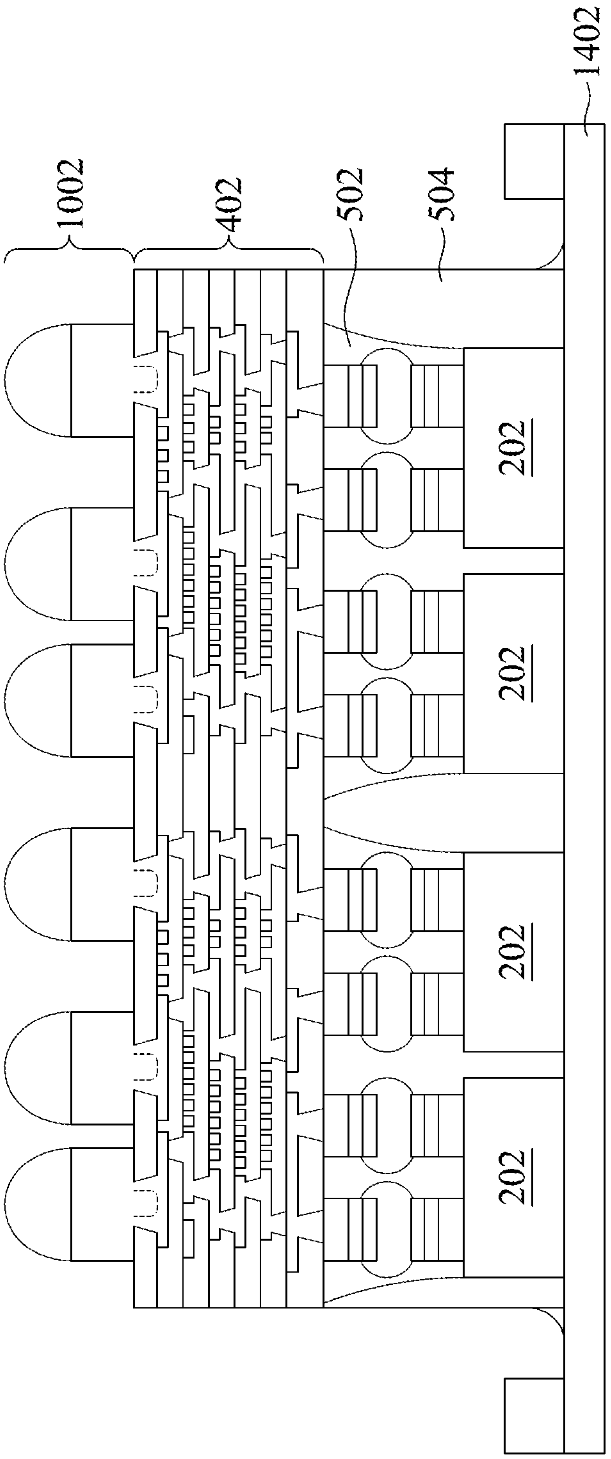

As discussed above, in an embodiment of the method 100 in block 114 the die are thinned through a grinding or polishing process such that the bridge 310 is removed from the structure. FIG. 15 is illustrative where the grinding as removed enough of the substrate 200 of the die 202 that the bridge 310 is no longer present. When the method 100 proceeds to block 116 where the multi-die structures (e.g., no separated die on the interposer) are mounted to a packaged substrate, the bridge 310 is omitted as illustrated in FIG. 16.

Figure 17A:
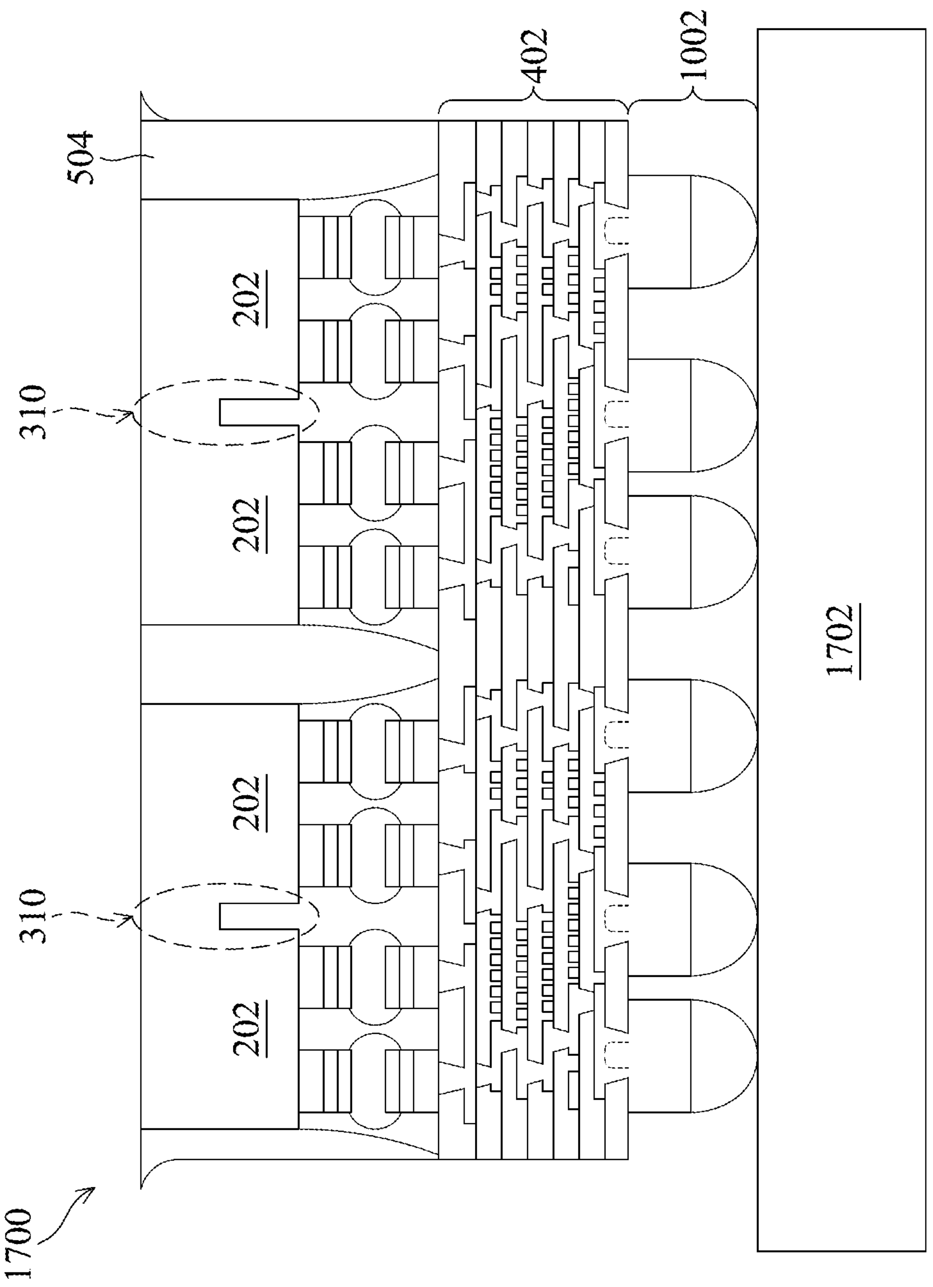
FIGS. 17A and 17B illustrate an embodiment of a multichip structure, in cross-sectional view and top view respectively, according to various aspects of the present disclosure.
Figure 17B:
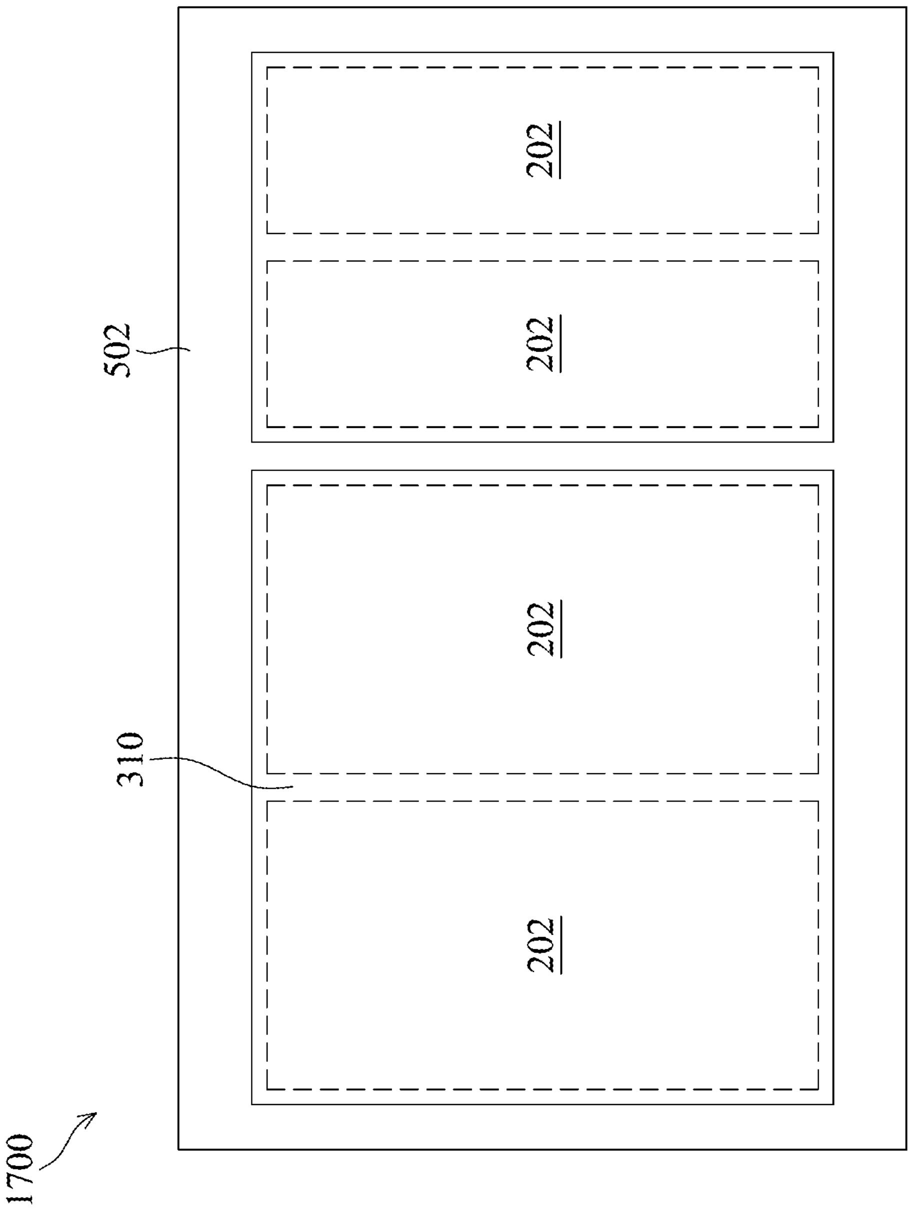

FIG. 17A, 17B are illustrative of an embodiment of a multichip or multi-die device 1700. The multi-die device 1700 may be fabricated using the method 100 of FIG. 1. In an embodiment, the multi-die device 1700 is a CoWoS device. The device 1700 includes die 202 disposed on an interposer 402, which is disposed on a package substrate 1702. In some implementations, the package substrate is a material such as an organic laminate. The components of the multi-die device 1700 may be substantially similar to those discussed above with reference to FIG. 1. FIG. 17B illustrates a top view.

Figure 18A:
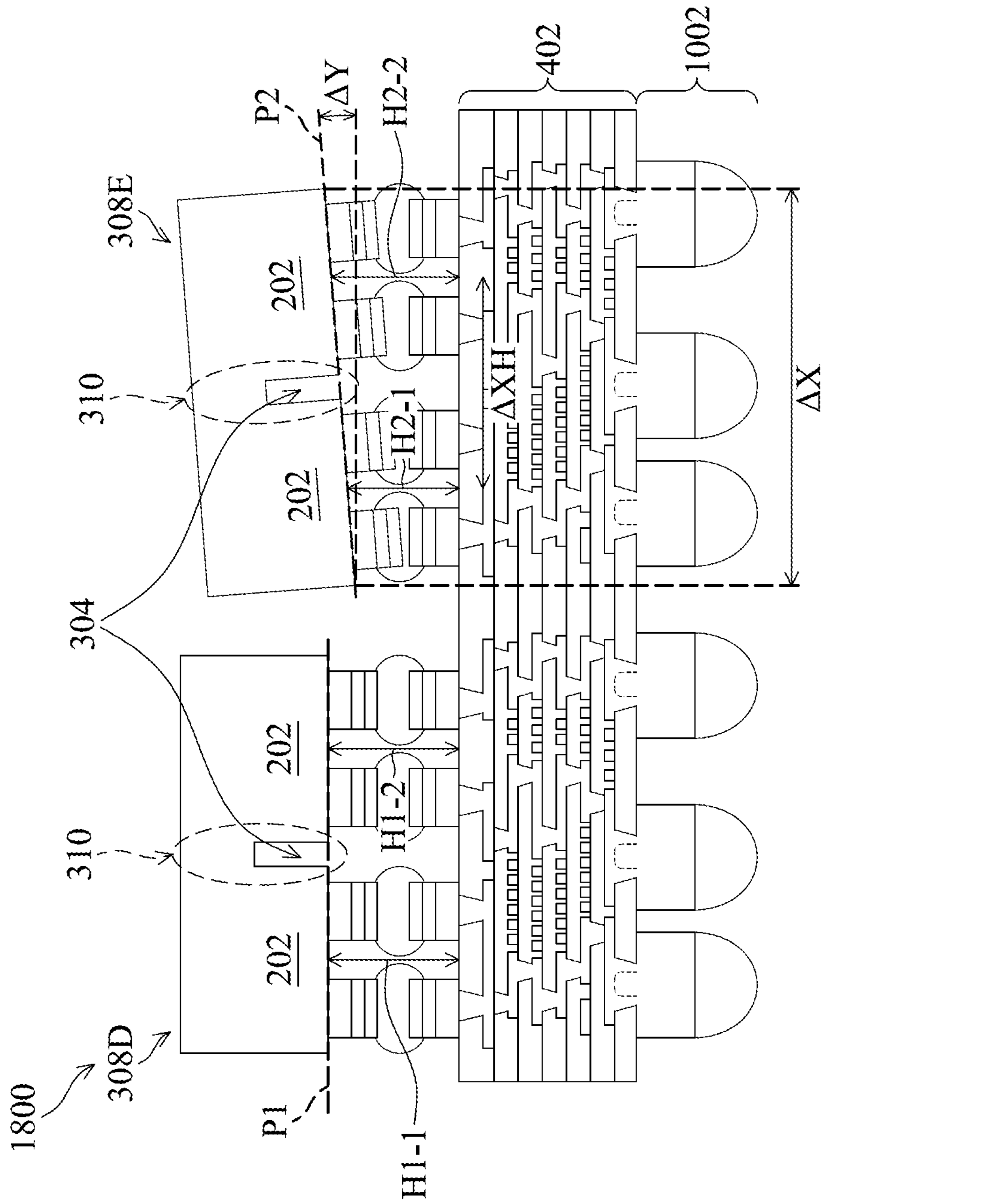
FIGS. 18A and 18B illustrate an embodiment of a multichip structure having at least one die group tilted, in cross-sectional view and top view respectively, according to various aspects of the present disclosure.
Figure 18B:
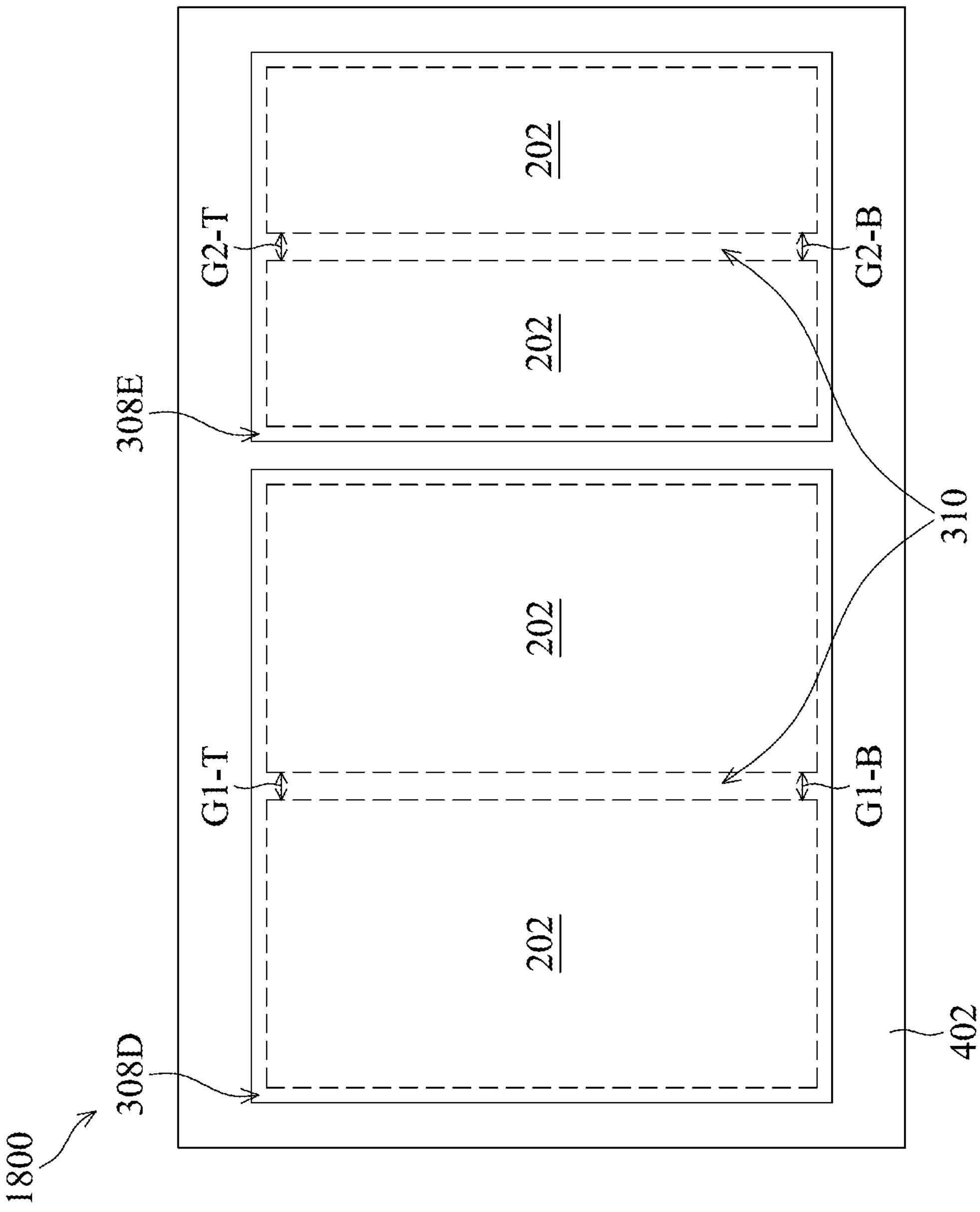

FIGS. 18A, 18B illustrate an embodiment of a multi-die structure 1800 that is substantially similar to as discussed above including FIGS. 17A, 17B. FIGS. 18A and 18B are illustrative of an embodiment of dimensional control afforded by the method 100. For instance, because the die 202 are part of a die grouping 308, in particular during the pick-and-place process, there is a degree of dimensional control that may not be experienced when placing individual die 202. In an embodiment, H1-1 is substantially equal to H1-2 in a die grouping 308. In an embodiment, H2-1 is different than H2-2. In a further embodiment, H2-1 varies linearly with H2-2 in a die grouping 308. That is $|H-2-H-1|/\Delta XH=\Delta Y/\Delta X$. In an embodiment, as illustrated in the die grouping 308D, a plane P1 coplanar with the bottom surfaces of the die 202 of the die grouping 308D has a slope of approximately zero. In an embodiment, as illustrated in the die grouping 308E, a plane P2 coplanar with the bottom surfaces of the die 202 of the die grouping 308E has a slope of greater than zero. This is different than two adjacent die 202 having a bottom surface on a different plane such as if the die 202 are tilted in different directions for example that may result from placing the die in individual operations.

In an embodiment, the die 202 of the die grouping 308D have a first gap at a first edge, illustrated as G1-B and a second gap distance at a second edge, illustrated as G1-T. In some embodiments, G1-B is approximately equal to G1-T. In an embodiment, $0 \le |G1\text{-}T-G1\text{-}B| \le 20$ μm. It is noted that, in an embodiment, the distance G1-T and G1-B are each equivalent to a length of the bridge 310 extending between the die 202. In an embodiment, the bridge 310, and thus each of G1-T and G1-B, is approximately equal to a scribe line 204 width. In an embodiment, the die 202 of the die grouping 308E have a first gap at a first edge, illustrated as G2-B, and a second gap distance at a second edge, illustrated as G2-T. In some embodiments, G2-B is approximately equal to G2-T. In an embodiment, $0 \le |G2\text{-}T-G2\text{-}B| \le 20$ μm. It is noted that the distance G2-T and G2-B is equivalent to a length of the bridge 310 extending between the die 202. In an embodiment, the bridge 310, and thus G2-T and G2-B are each approximately equal to a scribe line width. In some embodiments, G2-T and G1-T are different, for example if the die 202 from die grouping 308D are fabricated on a wafer with a different scribe line width than that of the wafer fabricating the die 202 from die grouping 308E.

Figure 19A:
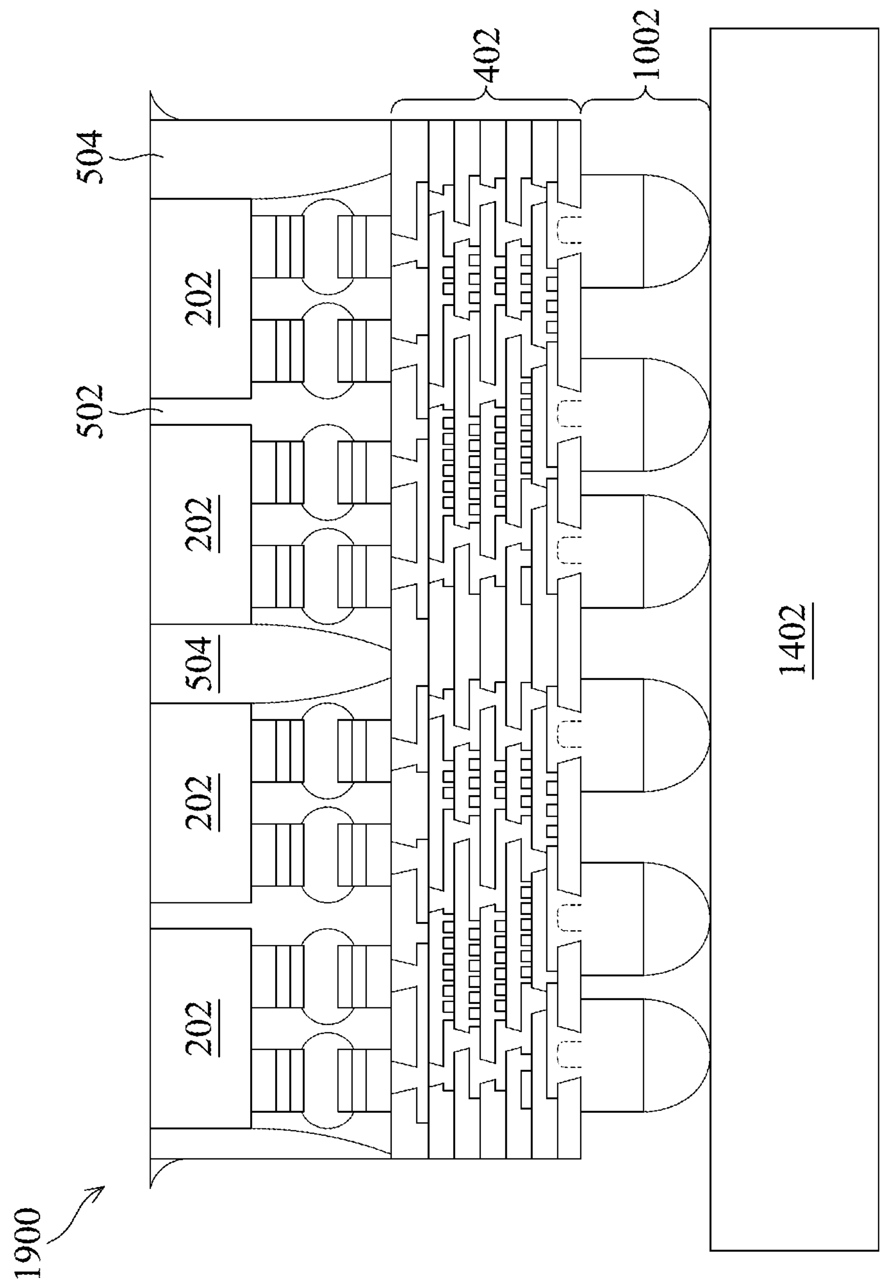
FIGS. 19A and 19B illustrate an alternative embodiment of a multichip structure, in a cross-sectional view and top view respectively, according to various aspects of the present disclosure.
Figure 19B:
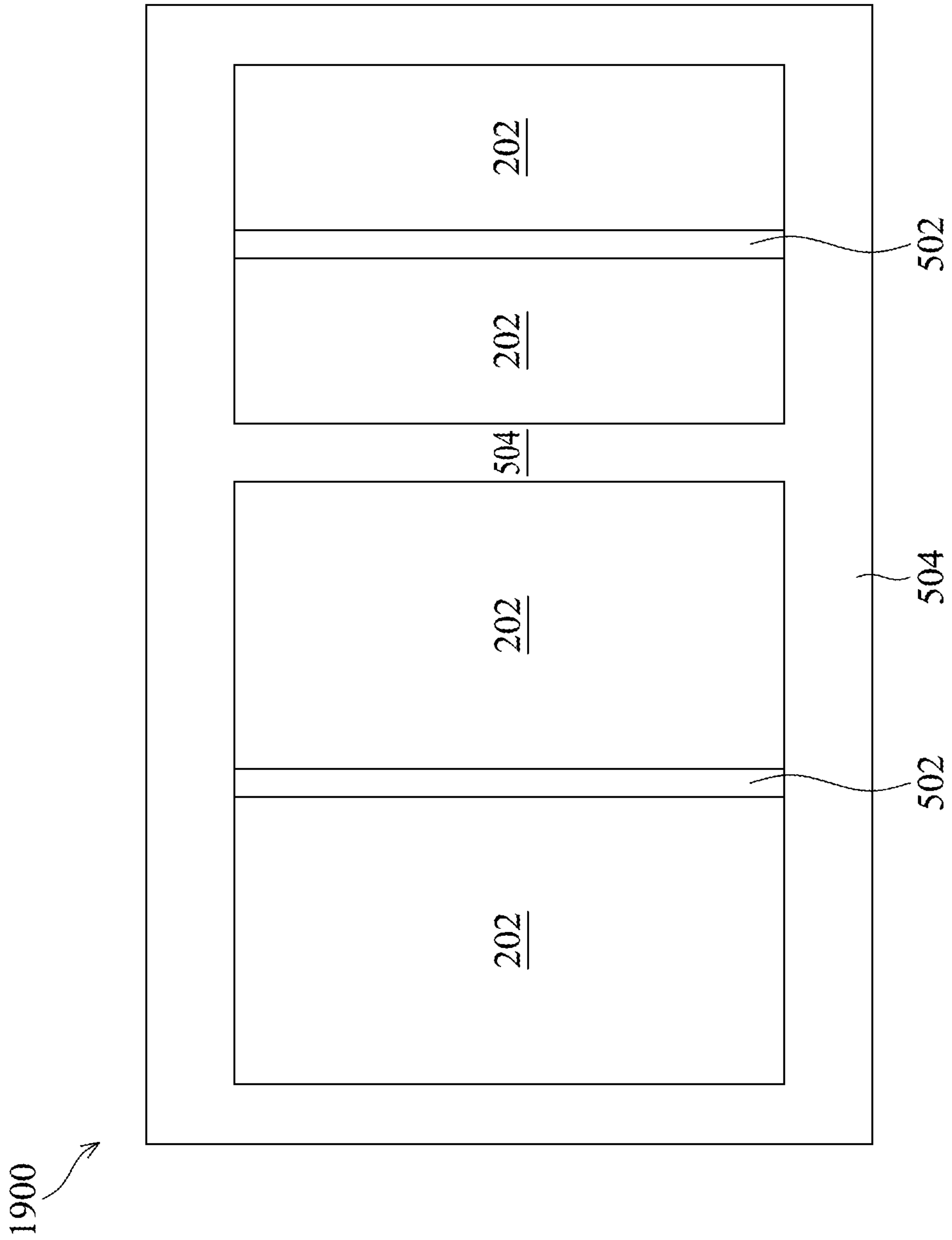

It is noted that while FIGS. 18A, 18B are illustrated with the bridge 310 in the groupings 308, in other embodiments, the bridge 310 may be removed as discussed above. In those embodiments, the dimensional analysis above remains the only difference being the gap (e.g., G1-T, G1-B, G2-T, G2-B) are filled with underfill structure 502 rather than the bridge 310 as illustrated in FIGS. 19A, 19B and the multi-die structure 1900. In an embodiment, the multi-die structure 1900 is a CoWoS device.

Thus, provided are embodiments of methods and devices having a multi-die structure. The multi-die structure is fabricated by performing half cuts during the die dicing operation to form die groupings, which are placed on another structure such as an interposer. The formation of die groupings allows for reduction in pick-and-place operations and/or dimensional control of the die such as die-to-die spacing.

The present disclosure provides for many different embodiments. An exemplary method includes receiving a wafer having a plurality of die and a plurality of scribe lines. A dicing process is performed on the wafer. The dicing process includes identifying a first scribe line of the plurality of scribe lines, the first scribe line interposing a first die and a second die of the plurality of die. A partial cut is performed on the first scribe line. After performing the partial cut, the first die and the second die are mounted on a substrate. The first die and the second die are connected by a portion of the first scribe line during the mounting.

In a further embodiment, a second scribe line of the plurality of scribe lines is identified and the second scribe line interposes the first die and a third die of the plurality of die. A full cut is performed on the second scribe line, the full cut separates the first die from the third die. In an embodiment, the partial cut removes between approximately 20% and 80% of a thickness of the first scribe line. In an embodiment, the substrate is an interposer.

In some implementations, the method includes attaching a third die to the interposer adjacent the first die and the second die. In an embodiment, the method includes attaching the substrate to a package substrate. In a further embodiment, after the mounting, the portion of the first scribe line is removed. In some implementations, removing the portion of the first scribe line includes performing a grinding process to thin the first die and the second die. In an embodiment, the first die and the second die are mounted to the substrate to form a chip-on-wafer-on-substrate (CoWoS) structure.

Another exemplary method includes receiving a wafer having a plurality of die and a plurality of scribe lines and attaching the wafer to a dicing tape. A dicing process is performed on the wafer on the dicing tape, which includes identifying a first scribe line and a second scribe line of the plurality of scribe lines. The first scribe line interposes a first die and a second die of the plurality of die and the second scribe line interposes the first die and a third die of the plurality of die. The first scribe line and the second scribe line have a first thickness measured from an interface with the dicing tape to an upper surface. The dicing process continues to remove a second thickness of the first scribe line, the second thickness is less than the first thickness. The first thickness of the second scribe line is removed such that the first die is separated from the third die. After the dicing process, the first die and the second die are mounted in a single pick and place step on a substrate.

In a further embodiment, during the mounting the first die and the second die, a third thickness of the first scribe line remains between the first die and the second die. The third thickness is the first thickness minus the second thickness. In some implementations, the first thickness of the second scribe line is removed in two steps. A first step of the two steps removes the second thickness, and a second step of the two steps removes a remaining portion of the second scribe line equal to the first thickness minus the second thickness.

In some implementations of the method, after mounting to the substrate, the first die and the second die are thinned, wherein the thinning removes the third thickness of the first scribe line. In an embodiment, when removing the second thickness a portion having a length equal to a width of the first scribe line is removed.

An exemplary device includes a chip-on-wafer-on substrate (CoWoS) device structure. The device structure includes a package substrate. An interposer is over the package substrate. A first die and a second die are disposed on the interposer. The first die has a first bottom surface and the second die has a second bottom surface. A plane coplanar with the first bottom surface and the second bottom surface has a slope greater than zero. The first die is spaced a first distance from the second die at a first edge of the first die and spaced a second distance from the second die at a second edge of the first die, the second edge opposing the first edge, and wherein the first distance is equal the second distance.

In an embodiment, first die and the second die are connected by a bridge. In some implementations, the bridge is a region of a scribe line. The bridge may include silicon. In an embodiment, a first set of bump structures interpose the first die and the interposer, and a second set of bump structures interpose the second die and the interposer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
receiving a wafer having a plurality of die and a plurality of scribe lines;
performing a dicing process on the wafer, wherein the dicing process includes:
identifying a first scribe line of the plurality of scribe lines, the first scribe line interposing a first die and a second die of the plurality of die;
performing a partial cut on the first scribe line to form a bridge connecting the first die and the second die;
identifying a second scribe line of the plurality of scribe lines, the second scribe line adjacent the first scribe line and interposing the second die and a third die of the plurality of die;
performing a partial cut on the second scribe line to form another bridge connecting the second die and the third die;
after performing the partial cut on the first scribe line and the partial cut on the second scribe line, performing a full cut on the second scribe line to remove the another bridge and singulate the third die;
after performing the partial cut, using a first pick and place process for mounting the first die and the second die on a substrate, wherein the first die and the second die are connected by the bridge during the mounting; and
after the full cut, using a second pick and place process for mounting the third die.

2. The method of claim 1, wherein the partial cut removes between approximately 20% and 80% of a thickness of the first scribe line.

3. The method of claim 1, wherein the substrate is an interposer.

4. The method of claim 3, further comprising:
attaching a fourth die to the interposer adjacent the first die and the second die, wherein the fourth die is a singulated die.

5. The method of claim 1, further comprising:
attaching the substrate to a package substrate.

6. The method of claim 1, further comprising: after the mounting, removing the first scribe line including the bridge.

7. The method of claim 6, wherein the removing the first scribe line including the bridge includes performing a grinding process to thin the first die and the second die.

8. The method of claim 1, wherein the first die and the second die are mounted to the substrate to form a chip-on-wafer-on-substrate (CoWoS) structure.

9. The method of claim 1, wherein the first die and the second die form a die grouping consisting of the first die and the second die.

10. The method of claim 1, wherein the second pick and place process places only the third die on another substrate.

11. A method comprising:
receiving a wafer having a plurality of die and a plurality of scribe lines;
attaching the wafer to a dicing tape;
performing a dicing process on the wafer on the dicing tape, wherein the dicing process includes:
identifying a first scribe line and a second scribe line of the plurality of scribe lines, the first scribe line interposing a first die and a second die of the plurality of die and the second scribe line interposing the first die and a third die of the plurality of die, wherein the first scribe line and the second scribe line have a first thickness measured from an interface with the dicing tape to an upper surface;

removing a second thickness of the first scribe line while the wafer is on the dicing tape to provide a bridge extending between the first die and the second die, wherein the second thickness is less than the first thickness;

removing the first thickness of the second scribe line such that the first die is separated from the third die, while the wafer is on the dicing tape and the first die and the second die are connected by the bridge;

after the dicing process, providing the wafer having the first die separated from the third die and the first die connected by the bridge to the second die to a pick and place operation;

using the pick and place operation for mounting the first die and the second die connected by the bridge in a first single pick and place step on a substrate; and after mounting the first die and the second die connected by the bridge, mounting the third die in a second single pick and place step.

12. The method of claim 11, wherein the removing the first thickness of the second scribe line is performed in two steps of the dicing process while the wafer is on the dicing tape.

13. The method of claim 12, wherein a first step of the two steps removes the second thickness, and a second step of the two steps removes a remaining portion of the second scribe line equal to the first thickness minus the second thickness, wherein the first scribe line continues to provide the bridge after the second step.

14. The method of claim 11, further comprising:

after mounting to the substrate, and removing the dicing tape, thinning the first die and the second die, wherein the thinning removes a remaining the thickness of the first scribe line.

15. The method of claim 11, wherein the removing the second thickness removes a portion having a length equal to a width of the first scribe line.

16. A method comprising:

receiving a wafer having a plurality of die and a plurality of scribe lines;

attaching the wafer to a dicing tape;

performing a dicing process on the wafer on the dicing tape, wherein the dicing process includes:

performing a first pass with a saw blade to perform a partial cut having a first distance within each of the plurality of scribe lines;

after performing the first pass, performing a second pass with the saw blade to perform a full cut within each of a first subset of the plurality of scribe lines while maintaining the partial cut in a second subset of the plurality of scribe lines; and after performing the dicing process, providing the diced wafer to a pick and place operation, wherein the provided diced wafer has a plurality of singulated die adjacent the first subset of the plurality of scribe lines and a plurality of die groups including the second subset of the plurality of scribe lines, wherein each die group includes at least two die separated by one scribe line of the second subset of scribe lines.

17. The method of claim 16, wherein the plurality of die groups includes a die group of four die.

18. The method of claim 16, wherein the plurality of die groups includes a die group consisting of two die.

19. The method of claim 16, wherein the second pass exposes a top surface of the dicing tape.

20. The method of claim 16, wherein the plurality of scribe lines includes a first scribe line, a second scribe line and a third scribe line, the second scribe line interposing the first and third scribe lines, wherein the second pass includes providing the saw blade on the second scribe line but not the first scribe line or the third scribe line.

* * * * *